United States Patent
Kitagawa et al.

(10) Patent No.: US 11,750,002 B2
(45) Date of Patent: Sep. 5, 2023

(54) BATTERY MONITORING APPARATUS

(71) Applicant: DENSO CORPORATION, Kariya (JP)

(72) Inventors: Masaaki Kitagawa, Kariya (JP); Shun Miyauchi, Kariya (JP); Takumi Shimizu, Kariya (JP)

(73) Assignee: DENSO CORPORATION, Kariya (JP)

( * ) Notice: Subject to any disclaimer, the term of this patent is extended or adjusted under 35 U.S.C. 154(b) by 427 days.

(21) Appl. No.: 16/937,424

(22) Filed: Jul. 23, 2020

(65) Prior Publication Data
US 2021/0028637 A1  Jan. 28, 2021

(30) Foreign Application Priority Data
Jul. 26, 2019 (JP) ................. 2019-137925

(51) Int. Cl.
*H02J 7/00* (2006.01)
*G01R 31/364* (2019.01)
*G01R 31/389* (2019.01)
*G01R 31/396* (2019.01)
(Continued)

(52) U.S. Cl.
CPC .......... *H02J 7/0047* (2013.01); *G01R 31/364* (2019.01); *G01R 31/389* (2019.01); *G01R 31/396* (2019.01); *H01M 10/44* (2013.01); *H01M 10/48* (2013.01); *H01M 2200/00* (2013.01)

(58) Field of Classification Search
CPC .. G01R 31/389; G01R 31/396; G01R 31/364; H01M 10/44; H01M 10/48; H01M 2200/00
USPC ......................................... 702/63
See application file for complete search history.

(56) References Cited

U.S. PATENT DOCUMENTS

| | | | |
|---|---|---|---|
| 11,630,156 B2 * | 4/2023 | Horiguchi ............ | G01R 31/382 429/90 |
| 2016/0195577 A1 | 7/2016 | Osaka et al. | |
| 2019/0011503 A1 | 1/2019 | Nagata | |

(Continued)

FOREIGN PATENT DOCUMENTS

| CN | 208172088 U | * 11/2018 |
|---|---|---|
| JP | 2000-277071 A | 10/2000 |

(Continued)

OTHER PUBLICATIONS

English translation of CN 208172088, 2018. (Year: 2018).*
English translation of WO 2012011237. (Year: 2012).*

*Primary Examiner* — Michael P Nghiem
(74) *Attorney, Agent, or Firm* — Oliff PLC

(57) ABSTRACT

A battery monitoring apparatus includes a circuit board, a signal control unit configured to cause a predetermined AC signal to be outputted from a storage battery through a first electrical path, a response signal input unit configured to input, through a pair of second electrical paths, a response signal of the storage battery to the AC signal, and a calculating unit configured to calculate, based on the response signal, a complex impedance of the storage battery. The first and second electrical paths are provided on a major face of the circuit board. On the circuit board, there is defined a first region which is surrounded by the first and second electrical paths and two terminals of the storage battery. The size of the first region is set to have an electromotive force, which is induced in the second electrical paths by the AC signal, be within an allowable electromotive-force range.

8 Claims, 19 Drawing Sheets

(51) Int. Cl.
*H01M 10/44* (2006.01)
*H01M 10/48* (2006.01)

(56) References Cited

U.S. PATENT DOCUMENTS

| | | | |
|---|---|---|---|
| 2019/0245185 A1 | 8/2019 | Ishihara | |
| 2020/0153055 A1* | 5/2020 | Moon | H01M 10/425 |
| 2021/0018567 A1* | 1/2021 | Horiguchi | H02J 7/1423 |

FOREIGN PATENT DOCUMENTS

| | | |
|---|---|---|
| JP | 2006-322857 A | 11/2006 |
| JP | 2014-186864 A | 10/2014 |
| JP | 2018-190502 A | 11/2018 |
| JP | 2021-018069 A | 2/2021 |
| WO | 2012/011237 A1 | 1/2012 |
| WO | WO-2012011237 * | 1/2012 |
| WO | 2012/026093 A1 | 3/2012 |
| WO | 2014/046028 A1 | 3/2014 |
| WO | 2020/218373 A1 | 10/2020 |

* cited by examiner

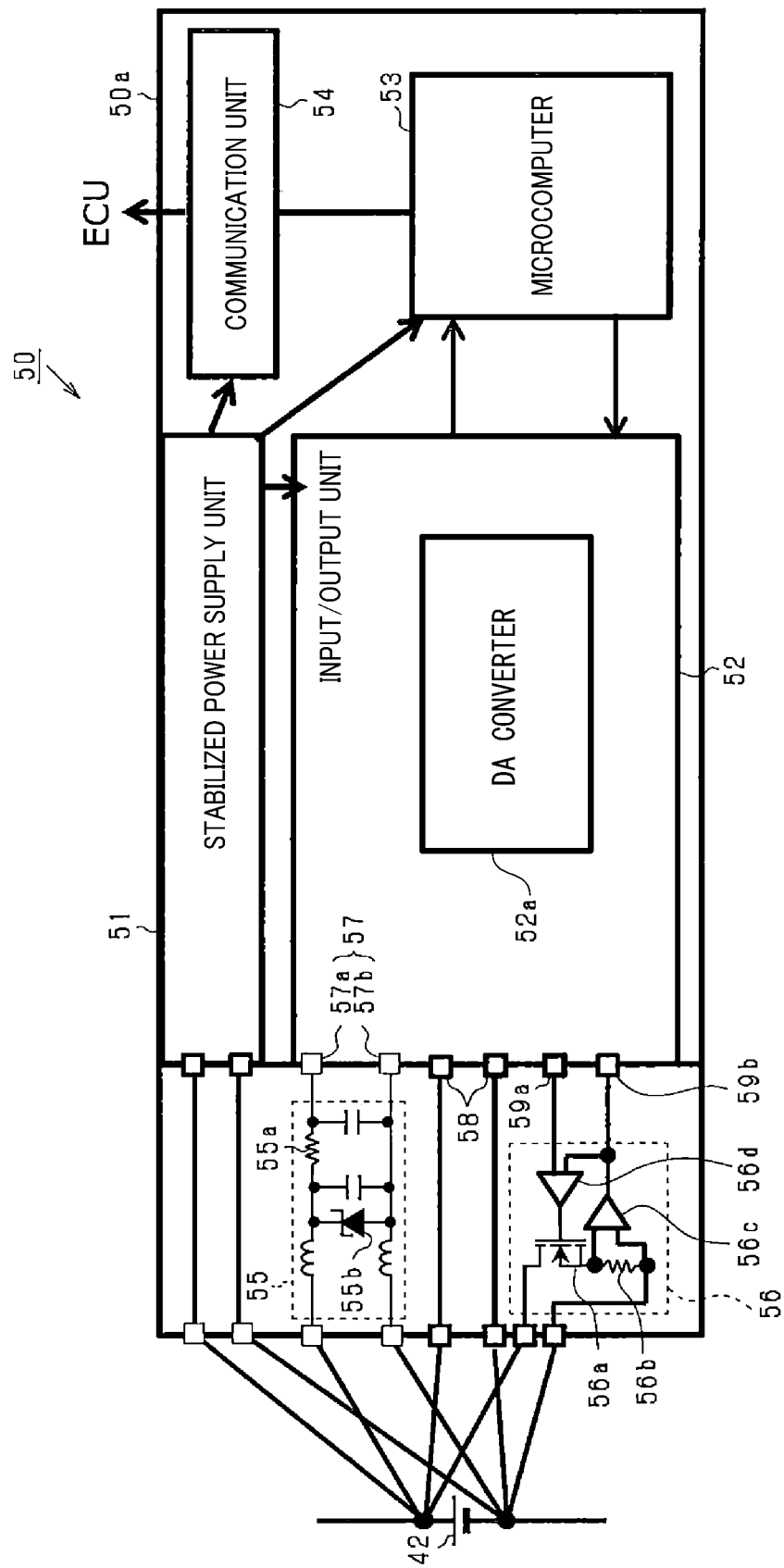

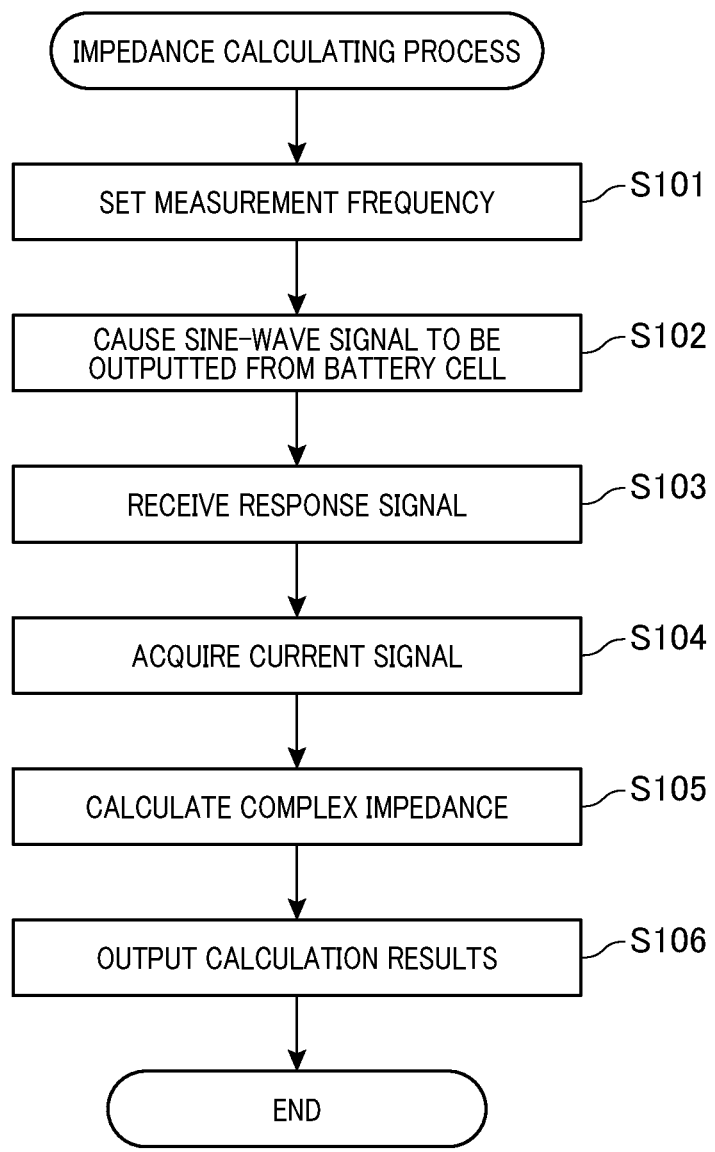

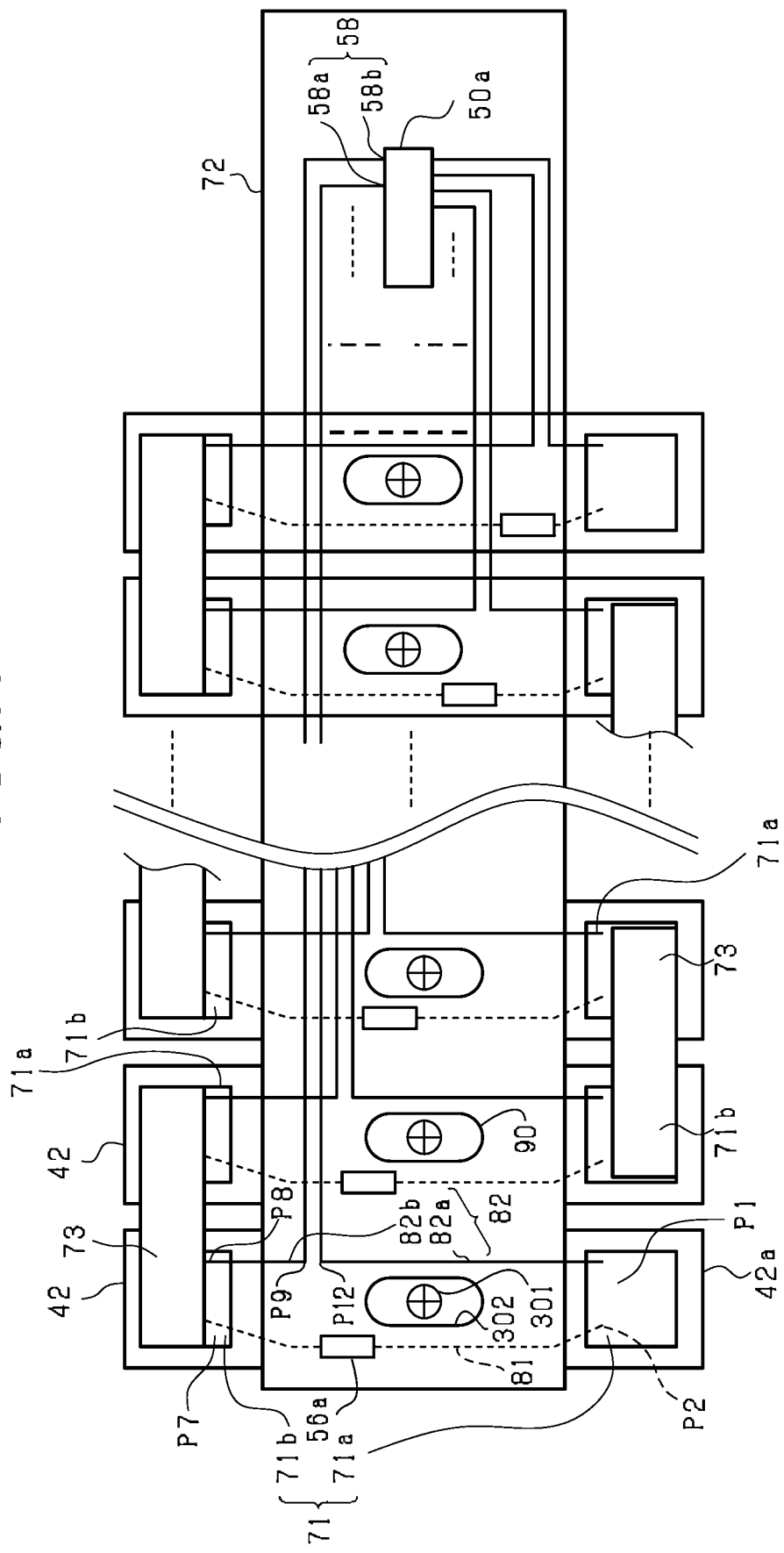

BATTERY MONITORING APPARATUS

CROSS-REFERENCE TO RELATED APPLICATION

This application is based on and claims priority from Japanese Patent Application No. 2019-137925 filed on Jul. 26, 2019, the contents of which are hereby incorporated by reference in their entirety into this application.

BACKGROUND

1 Technical Field

The present disclosure relates to battery monitoring apparatuses.

2 Description of Related Art

There is known a technique of measuring the complex impedance of a storage battery and thereby monitoring a state of the storage battery. Specifically, according to this technique, a rectangular-wave signal is applied to the storage battery by a power controller. Then, the complex impedance characteristics of the storage battery are calculated based on a response signal of the storage battery to the rectangular-wave signal. Thereafter, the SOH (i.e., state of health) of the storage battery is determined based on the calculated complex impedance characteristics.

Moreover, there is also known another technique of measuring the complex impedance of a storage battery and thereby monitoring a state of the storage battery. Specifically, according to this technique, a sine-wave signal is applied to the storage battery by an oscillator. Then, a response signal of the storage battery to the sine-wave signal (or voltage variation of the storage battery caused by the sine-wave signal) is detected by a lock-in amplifier. Thereafter, the complex impedance characteristics of the storage battery are calculated based on the detected response signal. Further, the SOH of the storage battery is determined based on the calculated complex impedance characteristics.

SUMMARY

According to the present disclosure, there is provided a battery monitoring apparatus for monitoring a state of a storage battery. The storage battery has a positive-electrode-side electric power supply terminal and a negative-electrode-side electric power supply terminal. The battery monitoring apparatus includes:

a planar circuit board arranged between the positive-electrode-side and negative-electrode-side electric power supply terminals of the storage battery;

a signal control unit provided in a first electrical path that connects the positive-electrode-side and negative-electrode-side electric power supply terminals of the storage battery, the signal control unit being configured to cause a predetermined AC signal to be outputted from the storage battery through the first electrical path;

a response signal input unit connected with the positive-electrode-side and negative-electrode-side electric power supply terminals of the storage battery respectively via a pair of second electrical paths, the response signal input unit being configured to input, through the pair of second electrical paths, a response signal of the storage battery to the AC signal; and a calculating unit configured to calculate, based on the response signal inputted by the response signal input unit, a complex impedance of the storage battery, wherein the first electrical path and the pair of second electrical paths are provided on a major face of the circuit board, on the circuit board, there is defined a first region which is surrounded by the first electrical path, the pair of second electrical paths and the positive-electrode-side and negative-electrode-side electric power supply terminals of the storage battery, and a size of the first region is set to have an induced electromotive force, which is induced in the pair of second electrical paths by the AC signal flowing through the first electrical path, be within an allowable electromotive-force range which includes zero.

BRIEF DESCRIPTION OF THE DRAWINGS

FIG. 2 is a configuration diagram of a battery monitoring apparatus according to a first embodiment.

FIG. 3 is a flow chart illustrating a complex impedance calculating process according to the first embodiment.

FIG. 4 is a schematic plan view illustrating the electrical connection between battery cells and corresponding battery monitoring apparatuses according to the first embodiment.

DESCRIPTION OF EMBODIMENTS

Figure 1:
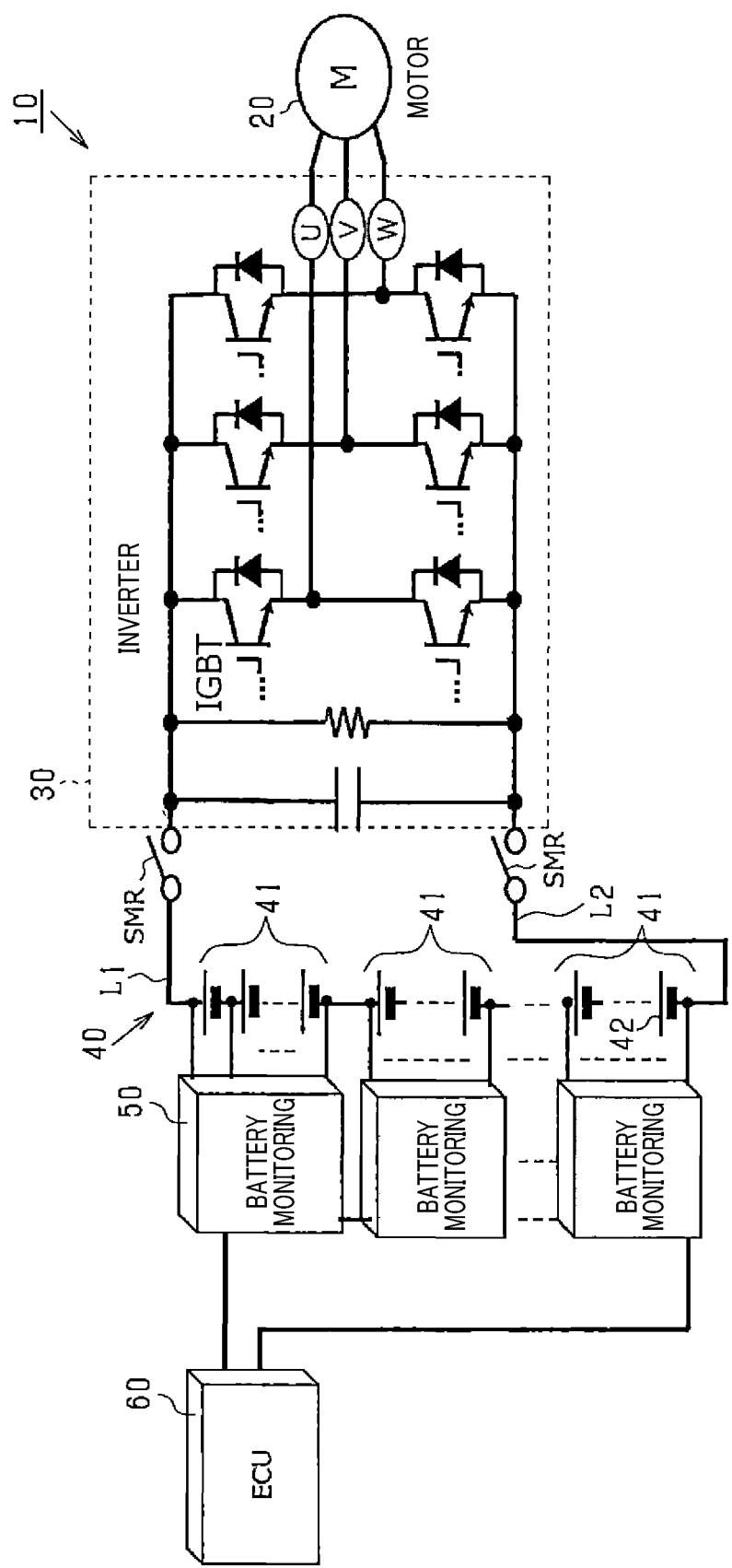
FIG. 1 is a schematic configuration diagram of an electric power supply system.

The inventors of the present application have found that the following problem may occur when either of the above-described techniques known in the art (see, for example, Japanese Patent No. JP6226261B2 and Japanese Patent Application Publication No. JP2018190502A) is used in a battery monitoring apparatus to measure the complex impedance of a storage battery. That is, the response signal of a storage battery to an AC signal (e.g., a rectangular-wave or sine-wave signal) applied to the storage battery is a very weak signal and thus susceptible to external influence. For example, when the AC signal is applied to the storage battery, an electromotive force will be induced, by a magnetic flux change due to the AC signal, in electrical paths through which the response signal is inputted or outputted. Since the response signal of the storage battery to the AC signal is a very weak signal, it may be affected by the induced electromotive force, resulting in an error in detection of the response signal.

In contrast, with the configuration of the above-described battery monitoring apparatus to the present disclosure, when the predetermined AC signal is outputted from the storage battery through the first electrical path, it will be possible to prevent a high electromotive force from being induced in the pair of second electrical paths by a magnetic flux change due to the AC signal. As a result, it becomes possible to suppress occurrence of an error in detection of the response signal, thereby improving the accuracy of calculating the complex impedance of the storage battery based on the detected response signal.

Exemplary embodiments will be described hereinafter with reference to the drawings. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

First Embodiment

FIG. 1 shows the overall configuration of an electric power supply system 10 which is provided in a vehicle (e.g., a hybrid vehicle or an electric vehicle) and in which battery monitoring apparatuses 50 according to the first embodiment are employed.

As shown in FIG. 1, the electric power supply system 10 includes a motor 20 that is a rotating electric machine, an inverter 30 that functions as an electric power converter to supply three-phase alternating current to the motor 20, a rechargeable battery pack 40, battery monitoring apparatuses 50 for monitoring a state of the battery pack 40, and an ECU 60 that controls the motor 20 and the inverter 30.

The motor 20 is a main machine of the vehicle. The motor 20 is mechanically connected with driving wheels (not shown) of the vehicle so that mechanical power (or torque) can be transmitted between the motor 20 and the driving wheels. In the present embodiment, the motor 20 is implemented by a three-phase permanent magnet synchronous motor.

The inverter 30 is configured with a full bridge circuit having a plurality of pairs of upper and lower arms. The number of pairs of the upper and lower arms is equal to the number of phase windings of the motor 20. Each of the upper and lower arms has a switch (or semiconductor switching element) provided therein. In operation, electric current supplied to the phase windings of the motor 20 is controlled by turning on/off the switches of the upper and lower arms.

Specifically, an inverter controller (not shown) is provided in the inverter 30. The inverter controller controls, based on various types of information detected in the motor 20 and a power running drive request (or torque generation request) or an electric power generation request, the on/off states of the switches in the inverter 30, thereby controlling energization of the phase windings of the motor 20. More specifically, the inverter controller controls the supply of electric power from the battery pack 40 to the motor 20 via the inverter 30, thereby driving the motor 20 to operate in a power running mode (or torque generation mode). Otherwise, when the motor 20 operates in an electric power generation mode (i.e., the motor 20 is driven by mechanical power transmitted from, for example, the driving wheels of the vehicle to generate three-phase AC power), the inverter controller controls the inverter 30 to function as a rectifier to rectify the three-phase AC power generated by the motor 20 into a DC power; the DC power is then supplied to the battery pack 40 to charge it.

That is, in the present embodiment, the motor 20 is configured as a motor-generator that operates selectively in either the power running mode or the electric power generation mode. Moreover, the inverter 30 is configured as an electric power converter that functions selectively as either an inverter or a rectifier.

The battery pack 40 is electrically connected with the motor 20 via the inverter 30. The battery pack 40 has a terminal voltage (i.e., voltage between two terminals) higher than or equal to, for example 100V. The battery pack 40 is configured with a plurality of battery modules 41 that are connected in series with each other. Moreover, each of the battery modules 41 is configured with a plurality of battery cells 42 that are connected in series with each other. The battery cells 42 may be implemented by, for example, lithium-ion batteries or nickel-metal hydride batteries. That is, each of the battery cells 42 is a storage battery which includes an electrolyte and a pair of electrodes.

To a positive-electrode-side electric power supply path L1 that is connected with a positive-electrode-side electric power supply terminal of the battery pack 40, there are connected positive-electrode-side terminals of electrical loads such as the inverter 30. On the other hand, to a negative-electrode-side electric power supply path L2 that is connected with a negative-electrode-side electric power supply terminal of the battery pack 40, there are connected negative-electrode-side terminals of the electrical loads. Moreover, in each of the positive-electrode-side and negative-electrode-side electric power supply paths L1 and L2, there is provided an SMR (i.e., system main relay) switch to selectively allow and interrupt flow of electric current through the electric power supply path.

The battery monitoring apparatuses 50 are provided to monitor the SOC (i.e., state of charge) and/or SOH (i.e., state of health) of each of the battery cells 42. More particularly, in the present embodiment, for each of the battery cells 42, there is provided a corresponding one of the battery monitoring apparatuses 50 to monitor the SOC and/or SOH of the battery cell 42. The battery monitoring apparatuses 50 are connected with the ECU 60 so as to output the monitored states of the battery cells 42 to the ECU 60. The configuration of the battery monitoring apparatuses 50 will be described in detail later.

The ECU 60 selectively makes, based on various types of information, either the power running drive request or the electric power generation request to the inverter controller. The various types of information include, for example, accelerator operation information, brake operation information, the vehicle speed and the state of the battery pack 40.

Next, the configuration of each of the battery monitoring apparatuses 50 according to the present embodiment will be described with reference to FIG. 2. In addition, as mentioned previously, in the present embodiment, for each of the battery cells 42, there is provided a corresponding one of the battery monitoring apparatuses 50.

As shown in FIG. 2, each of the battery monitoring apparatuses 50 includes an ASIC (Application-Specific Integrated Circuit) 50a, a filter unit 55 and a current modulation circuit 56.

The ASIC 50a includes a stabilized power supply unit 51, an input/output unit 52, a microcomputer 53 that functions as a calculating unit, and a communication unit 54.

The stabilized power supply unit 51 is connected with electric power supply lines of the battery cell 42. The stabilized power supply unit 51 is configured to supply electric power from the battery cell 42 to the input/output unit 52, the microcomputer 53 and the communication unit 54. Consequently, the input/output unit 52, the microcomputer 53 and the communication unit 54 operate on the electric power supplied by the stabilized power supply unit 51.

The input/output unit 52 is connected with the battery cell 42 that is the monitoring target. Specifically, the input/output unit 52 has DC voltage input terminals 57 via which the DC voltage (or terminal voltage) of the battery cell 42 is inputted to (or measured by) the battery monitoring apparatus 50. Between the battery cell 42 and the DC voltage input terminals 57, there is provided the filter unit 55. More specifically, the DC voltage input terminals 57 consist of a positive-electrode-side input terminal 57a and a negative-electrode-side input terminal 57b. On the other hand, the filter unit 55 has RC (Resistor-Capacitor) filters 55a as filter circuits and a Zener diode 55b as a protective element. The RC filters 55a and the Zener diode 55b are provided between the positive-electrode-side input terminal 57a and the negative-electrode-side input terminal 57b of the input/output unit 52. That is, the RC filters 55a and the Zener diode 55b are connected in parallel with the battery cell 42.

Moreover, the input/output unit 52 also has response signal input terminals 58 via which a response signal (or voltage variation) indicative of the internal complex impedance information of the battery cell 42 is inputted to the battery monitoring apparatus 50. That is, in the present embodiment, the input/output unit 52 functions as a response signal input unit of the battery monitoring apparatus 50.

Furthermore, the input/output unit 52 is connected with the current modulation circuit 56 that functions as a signal control unit. The input/output unit 52 has a command signal output terminal 59a via which a command signal is outputted to the current modulation circuit 56; the command signal is indicative of a command commanding the current modulation circuit 56 to cause a predetermined sine-wave signal (or AC signal) to be outputted from the battery cell 42. Moreover, the input/output unit 52 also has a feedback signal input terminal 59b via which current signal, which is actually outputted from (or actually flows out of) the battery cell 42, is inputted as a feedback signal to the input/output unit 52 through the current modulation circuit 56.

The input/output unit 52 is also connected with the microcomputer 53 so as to output to the microcomputer 53 the DC voltage inputted via the DC voltage input terminals 57, the response signal inputted via the response signal input terminals 58 and the feedback signal inputted via the feedback signal input terminal 59b. In addition, the input/output unit 52 includes an AD (Analog-to-Digital) converter (not shown) therein; the AD converter is configured to convert inputted analog signals into digital signals and output the resultant digital signals to the microcomputer 53.

Moreover, the input/output unit 52 is configured to: input the command signal from the microcomputer 53; and output the command signal to the current modulation circuit 56 via the command signal output terminal 59a. In addition, the input/output unit 52 also includes a DA (Digital-to-Analog) converter 52a therein; the DA converter 52a is configured to convert digital signals inputted from the microcomputer 53 into analog signals and output the resultant analog signals to the current modulation circuit 56.

In the present embodiment, a DC bias is applied to the sine-wave signal, which is commanded by the command signal to the current modulation circuit 56, so as to prevent the sine-wave signal from becoming a negative current (or reverse current with respect to the battery cell 42).

The current modulation circuit 56 is configured to cause a predetermined AC signal (i.e., sine-wave signal) to be outputted from the battery cell 42 that is the monitoring target, with the battery cell 42 itself being the electric power source for the output of the predetermined AC signal. Specifically, the current modulation circuit 56 includes a semiconductor switch element (e.g., a MOSFET) 56a and a resistor 56b connected in series with the semiconductor switch element 56a. The semiconductor switch element 56a has its drain terminal connected to a positive-electrode-side electric power supply terminal 71a of the battery cell 42 and its source terminal serially connected to one end of the resistor 56b. Moreover, the other end of the resistor 56b is connected to a negative-electrode-side electric power supply terminal 71b of the battery cell 42. The semiconductor switch element 56a is configured to be capable of regulating the amount of electric current flowing between its drain and its source.

It should be noted that depending on the operating region of the semiconductor switch element 56a, an additional resistor may be inserted in series with the semiconductor switch element 56a in the current modulation circuit 56 so as to adjust the voltage applied to the semiconductor switch element 56a.

Figure 7A:
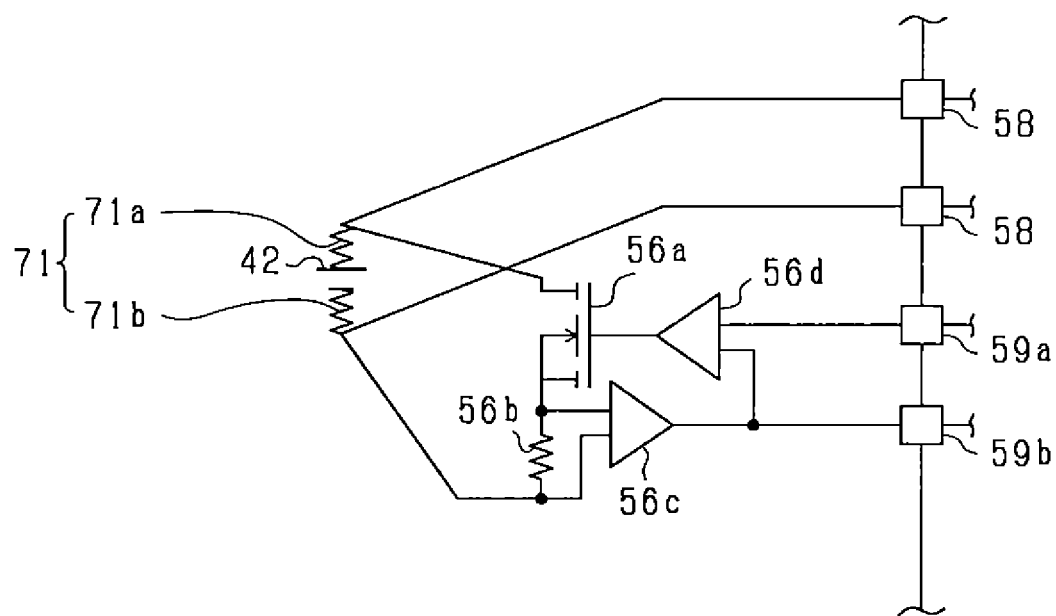
FIG. 7A is a schematic diagram illustrating undesirable locations at which response signal input terminals of a battery monitoring apparatus could be connected respectively to electric power supply terminals of a battery cell.
Figure 7B:
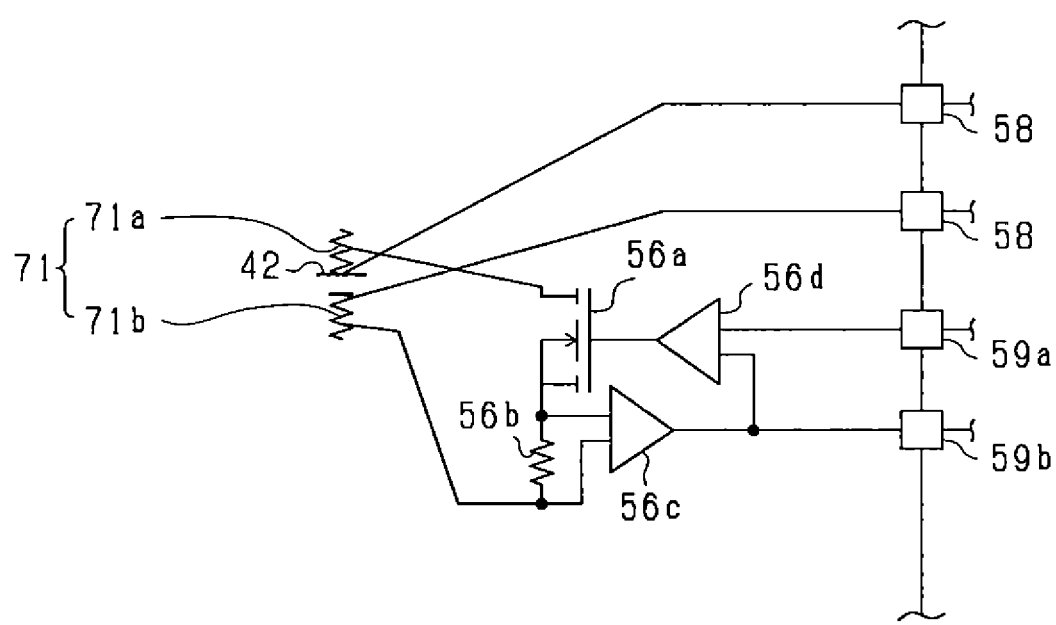
FIG. 7B is a schematic diagram illustrating desirable locations at which the response signal input terminals of the battery monitoring apparatus are connected respectively to the electric power supply terminals of the battery cell.

In addition, the positive-electrode-side and negative-electrode-side electric power supply terminals 71a and 71b of the battery cell 42 are connected respectively with positive and negative electrodes of the battery cell 42 (see FIGS. 7A-7B). It is desirable for the response signal input terminals 58 to be connected respectively to, of all connectable portions of the electric power supply terminals 71a and 71b of the battery cell 42, those connectable portions which are located closest to the electrodes of the battery cell 42 (see FIG. 7B). Similarly, it is desirable for the DC voltage input terminals 57 to be connected respectively to those connectable portions of the electric power supply terminals 71a and 71b which are located closest to the electrodes or those connectable portions of the electric power supply terminals 71a and 71b which are located second closest to the electrodes with the response signal input terminals 58 being connected to the closest connectable portions to the electrodes. In these cases, it is possible to minimize the influence of a voltage drop, which is caused by main current or equalization current, on the response signal inputted to the battery monitoring apparatus 50 via the response signal input terminals 58 and the DC voltage inputted to the battery monitoring apparatus 50 via the DC voltage input terminals 57.

Moreover, in the current modulation circuit 56, there is provided a current detection amplifier 56c which is connected to both ends of the resistor 56b to function as a current detection unit. Specifically, the current detection amplifier 56c is configured to detect a signal (i.e., current signal) flowing through the resistor 56b and output the detected signal as the feedback signal to the feedback signal input terminal 59b of the input/output unit 52.

Furthermore, in the current modulation circuit 56, there is also provided a feedback circuit 56d. The feedback circuit 56d is configured to: (1) input the command signal from the command signal output terminal 59a of the input/output unit 52 and the feedback signal from the current detection amplifier 56c; (2) compare the command signal and the feedback signal; and (3) output a signal indicative of the result of the comparison to a gate terminal of the semiconductor switch element 56a.

Based on the signal outputted from the feedback circuit 56d, the semiconductor switch element 56a regulates the voltage applied between its gate and its source and thereby regulates the amount of electric current flowing between its drain and its source, so as to cause the sine-wave signal (or predetermined AC signal) commanded by the command signal to be outputted from the battery cell 42. In addition, when there is a deviation between the waveform of the sine-wave signal commanded by the command signal and the waveform of the sine-wave signal actually flowing through the resistor 56b, the semiconductor switch element 56a regulates the amount of electric current based on the signal outputted from the feedback circuit 56d, thereby correcting the deviation. Consequently, the sine-wave signal flowing through the resistor 56b can be stabilized.

Next, a process of calculating the complex impedance of each of the battery cells 42 according to the present embodiment will be described with reference to FIG. 3. This process is repeatedly performed by the corresponding battery monitoring apparatus 50 in a predetermined cycle.

In the complex impedance calculating process, first, in step S101, the microcomputer 53 of the corresponding battery monitoring apparatus 50 sets a measurement frequency of the complex impedance within a predetermined frequency range.

In step S102, the microcomputer 53 sets the frequency of the sine-wave signal (or predetermined AC signal) based on the measurement frequency set in step S101. Then, the microcomputer 53 outputs the command signal to the input/output unit 52. As described previously, the command signal is indicative of a command commanding the current modulation circuit 56 to cause the sine-wave signal to be outputted from the battery cell 42.

Upon the command signal being inputted thereto, the input/output unit 52 outputs the command signal, through the digital-to-analog conversion by the DA converter, to the current modulation circuit 56. Then, according to the command signal, the current modulation circuit 56 causes the sine-wave signal to be outputted from the battery cell 42 that is the monitoring target, with the battery cell 42 itself being the electric power source for the output of the sine-wave signal.

More specifically, in the current modulation circuit 56, the semiconductor switch element 56a regulates the amount of electric current based on the signal inputted thereto via the feedback circuit 56d, so as to cause the sine-wave signal commanded by the command signal to be outputted from the battery cell 42. Consequently, the sine-wave signal is outputted from the battery cell 42.

Upon the sine-wave signal being outputted from the battery cell 42, in other words, upon application of a disturbance to the battery cell 42, variation occurs in the voltage between the terminals of the battery cell 42; the voltage variation is indicative of the internal complex impedance information of the battery cell 42. Then, the input/output unit 52 outputs the voltage variation, which is inputted to the input/output unit 52 via the response signal input terminals 58, as the response signal to the microcomputer 53. More specifically, the input/output unit 52 outputs the response signal through the analog-to-digital conversion by the AD converter.

In step S103, the microcomputer 53 receives the response signal outputted from the input/output unit 52.

In step S104, the microcomputer 53 acquires the current signal flowing through the resistor 56b of the current modulation circuit 56 (i.e., the sine-wave signal outputted from the battery cell 42). Specifically, the microcomputer 53 receives, via the input/output unit 52, the feedback signal (or detected signal) outputted from the current detection amplifier 56c as the current signal.

In addition, instead of the feedback signal, a signal which is proportional to the command signal outputted to the current modulation circuit 56 may be used as the current signal.

In step S105, the microcomputer 53 calculates the complex impedance of the battery cell 42 based on both the response signal and the current signal. Specifically, the microcomputer 53 calculates at least one of the real part, the imaginary part, the absolute value and the phase of the complex impedance on the basis of the amplitude of the response signal and the phase difference of the response signal from the current signal.

In step S106, the microcomputer 53 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

Next, the electrical connection between the battery cells 42 and the corresponding battery monitoring apparatuses 50 will be described with reference to FIG. 4.

FIG. 4 is a schematic plan view, from the upper side (i.e., the side where the electric power supply terminals 71 of the battery cells 42 are located), of the battery cells 42 and the corresponding battery monitoring apparatuses 50.

As shown in FIG. 4, each of the battery cells 42 has a receiving case 42a in which are received other components of the battery cell 42, such as the electrolyte and the electrodes. In the present embodiment, each of the battery cells 42 (more specifically, the receiving case 42a thereof) is shaped as a flat rectangular cuboid. Moreover, each of the battery cells 42 has its electric power supply terminals 71 (i.e., positive-electrode-side and negative-electrode-side electric power supply terminals 71a and 71b) provided on an upper end face thereof. More specifically, each of the battery cells 42 has its electric power supply terminals 71 provided respectively on opposite end portions of the upper end face in a longitudinal direction thereof (i.e., the vertical direction in FIG. 4).

The battery cells 42 are stacked in a lateral direction thereof (i.e., the left-right direction in FIG. 4) so as to have side faces of the receiving cases 42a thereof superposed on one another. More specifically, the battery cells 42 are stacked so that for each adjacent pair of the battery cells 42, the positive-electrode-side and negative-electrode-side electric power supply terminals 71a and 71b of one of the pair of the battery cells 42 are aligned in the lateral direction respectively with the negative-electrode-side and positive-electrode-side electric power supply terminals 71b and 71a of the other of the pair of the battery cells 42. Consequently, the positive-electrode-side electric power supply terminals 71a of the battery cells 42 are arranged alternately with the negative-electrode-side electric power supply terminals 71b of the battery cells 42 in the lateral direction.

Moreover, for each of the battery cells 42, the positive-electrode-side electric power supply terminal 71a of the battery cell 42 is connected, via a busbar 73, to the negative-electrode-side electric power supply terminal 71b of that one of the battery cells 42 which is located on one lateral side of and adjacent to the battery cell 42; the negative-electrode-side electric power supply terminal 71b of the battery cell 42 is connected, via a busbar 73, to the positive-electrode-side electric power supply terminal 71a of that one of the battery cells 42 which is located on the other lateral side of and adjacent to the battery cell 42. Consequently, all the battery cells 42 are electrically connected in series with each other via the busbars 73.

Each of the busbars 73 is formed of an electrically conductive material and thin plate-shaped. Moreover, each of the busbars 73 has a length sufficient to connect one adjacent pair of the electric power supply terminals 71 of the battery cells 42 in the lateral direction, for example a length approximately twice the thickness of each of the battery cells 42 in the lateral direction. Furthermore, each of the busbars 73 is joined (e.g., by welding) to one adjacent pair of the electric power supply terminals 71 of the battery cells 42 so as to cover outer end portions (or outer halves) of the pair of the electric power supply terminals 71 in the longitudinal direction of the battery cells 42.

Between the positive-electrode-side electric power supply terminal 71a and negative-electrode-side electric power supply terminal 71b of each of the battery cells 42, there is arranged a planar circuit board 72. The circuit board 72 is implemented by, for example, a PCB (Printed Circuit Board) or FPC (Flexible Printed Circuit). On the circuit board 72, electrical paths (or signal wirings) formed of an electrically conductive metal extend to connect circuit elements arranged on the circuit board 72.

More specifically, the electrical paths are formed basically in pairs on the circuit board 72. For example, in each of the battery monitoring apparatuses 50, to apply the signal, which is indicative of the result of the comparison made in the feedback circuit 56d, to the gate terminal of the semiconductor switch element 56a (see FIG. 2), both a supply electrical path for supplying the signal to the gate terminal and a return electrical path of the signal are formed on the circuit board 72.

The circuit elements arranged (or fixed) on the circuit board 72 include, for example, those circuit elements which constitute the ASIC 50a, the filter unit 55 and the current modulation circuit 56 of each of the battery monitoring apparatuses 50. More particularly, in the present embodiment, there is provided only a single ASIC 50a common to all the battery monitoring apparatuses 50. In other words, the single ASIC 50a is shared by all the battery monitoring apparatuses 50.

It should be noted that for the sake of simplicity, in FIG. 4, there are illustrated only the single ASIC 50a and the semiconductor switch elements 56a of the current modulation circuits 56 of the battery monitoring apparatuses 50.

As shown in FIG. 4, the circuit board 72 is formed to extend in the stacking direction of the battery cells 42 (i.e., the left-right direction in FIG. 4) over the entire range of the stacked battery cells 42. Moreover, the circuit board 72 is interposed between the electric power supply terminals 71 (i.e., the positive-electrode-side and negative-electrode-side electric power supply terminals 71a and 71b) of each of the battery cells 42. In addition, the circuit board 72 is arranged to have its lower major face facing the upper end faces of the battery cells 42 on which the electric power supply terminals 71 of the battery cells 42 are respectively provided.

For each of the battery cells 42, the corresponding semiconductor switch element 56a (i.e., the semiconductor switch element 56a of that one of the battery monitoring apparatuses 50 which corresponds to the battery cell 42) is arranged between the electric power supply terminals 71 of the battery cell 42.

In contrast, the ASIC 50a is arranged on an end portion (i.e., right end portion in FIG. 4) of the circuit board 72 in a longitudinal direction of the circuit board 72 (or the stacking direction of the battery cells 42) so as not to overlap any of the battery cells 42.

As shown with dashed lines in FIG. 4, for each of the battery cells 42, there is formed a first electrical path 81 in a straight line on an upper major face of the circuit board 72 to connect the positive-electrode-side and negative-electrode-side electric power supply terminals 71a and 71b of the battery cell 42. In the first electrical path 81, there is provided the corresponding semiconductor switch element 56a (or the semiconductor switch element 56a of the current modulation circuit 56 of the corresponding battery monitoring apparatus 50). As described previously, the corresponding semiconductor switch element 56a, i.e., the corresponding current modulation circuit 56 is configured to cause the predetermined AC signal to be outputted from the battery cell 42 through the first electrical path 81.

Moreover, as shown with solid lines in FIG. 4, for each of the battery cells 42, there are also formed a pair of second electrical paths 82 on the upper major face of the circuit board 72 to connect the electric power supply terminals 71 of the battery cell 42 to the corresponding response signal input terminals 58 of the input/output unit 52 of the ASIC 50a. In other words, the input/output unit 52 of the ASIC 50a is connected with the electric power supply terminals 71 of the battery cell 42 respectively via the pair of second electrical paths 82.

More specifically, the pair of second electrical paths 82 consists of a positive-electrode-side second electrical path 82a connected with the positive-electrode-side electric power supply terminal 71a of the battery cell 42 and a negative-electrode-side second electrical path 82b connected with the negative-electrode-side electric power supply terminal 71b of the battery cell 42. Similarly, the corresponding response signal input terminals 58 of the ASIC 50a consist of a corresponding positive-electrode-side response signal input terminal 58a connected with the positive-electrode-side second electrical path 82a and a corresponding negative-electrode-side response signal input terminal 58b connected with the negative-electrode-side second electrical path 82b.

The positive-electrode-side second electrical path 82a is formed to: first extend in a straight line from the positive-electrode-side electric power supply terminal 71a toward the negative-electrode-side electric power supply terminal 71b; then be bent at a right angle of 90° to extend in the longitudinal direction of the circuit board 72 to the end portion of the circuit board 72 where the ASIC 50a is arranged; and thereafter be bent again at a right angle of 90° to extend to the corresponding positive-electrode-side response signal input terminal 58a of the ASIC 50a.

Similarly, the negative-electrode-side second electrical path 82b is formed to: first extend in a straight line from the negative-electrode-side electric power supply terminal 71b toward the positive-electrode-side electric power supply terminal 71a; then be bent, at a position separated from the positive-electrode-side second electrical path 82a, at a right angle of 90° to extend parallel to the positive-electrode-side second electrical path 82a in the longitudinal direction of the circuit board 72 to the end portion of the circuit board 72 where the ASIC 50a is arranged; and thereafter be bent again at a right angle of 90° to extend to the corresponding negative-electrode-side response signal input terminal 58b of the ASIC 50a.

It should be noted that the second electrical paths 82 may be bent at a right angle of 90° with or without a bending radius. It also should be noted that the second electrical paths 82 may alternatively be bent at an angle not equal to 90° or be bent to form arc-shaped or chamfered corners.

In addition, the second electrical paths 82 intersect the first electrical paths 81 connected with the other battery cells 42. Therefore, to prevent direct contact with the first electrical paths 81, the second electrical paths 82 are formed in a different layer from the first electrical paths 81 at least at locations where the second electrical paths 82 intersect the first electrical paths 81.

On the other hand, if the second electrical paths 82 were formed in a different layer from the first electrical path 81 that is connected with the same battery cell 42 as the second electrical paths 82, the stray capacitance between the first electrical path 81 and the second electrical paths 82 would become high due to the dielectric material (i.e., part of the circuit board 72) interposed therebetween. Therefore, in the present embodiment, the first electrical path 81 and the second electrical paths 82 connected with the same battery cell 42 are formed in the same layer.

Moreover, though not shown in FIG. 4, in the case of the first electrical path 81 and the second electrical paths 82 connected with the same battery cell 42 intersecting each other, it is desirable for the first electrical path 81 and the second electrical paths 82 to be formed respectively in different layers only at locations where they intersect each other. Furthermore, in this case, it is preferable for the second electrical paths 82 to extend perpendicular to the first electrical path 81 so as to minimize the region where the second electrical paths 82 intersect the first electrical path 81.

In addition, in the present embodiment, those portions of the second electrical paths 82 which intersect the first electrical paths 81 connected with the other battery cells 42 are formed in a different layer from the other portions of the second electrical paths 82. Further, the areas (or sizes) of those portions of the second electrical paths 82 which are formed in a different layer from the other portions of the second electrical paths 82 are minimized. Consequently, the stray capacitance between the second electrical paths 82 and the first electrical paths 81 connected with the other battery cells 42 has no or only small influence on the response signal transmitted through the second electrical paths 82.

The above-described first and second electrical paths 81 and 82 are formed for each of the battery cells 42. In particular, the second electrical paths 82 are formed to minimize overlap thereof with the semiconductor switch elements 56a of the battery monitoring apparatuses 50 and the first and second electrical paths 81 and 82 connected with the other battery cells 42. More specifically, the semiconductor switch elements 56a connected respectively with the battery cells 42 are offset from each other in a lateral direction of the circular board 72 (i.e., the vertical direction in FIG. 4). Moreover, all the pairs of the second electrical paths 82 connected respectively with the battery cells 42 extend parallel to each other in the longitudinal direction of the circuit board 72 (i.e., the left-right direction in FIG. 4). Further, all the pairs of the second electrical paths 82 connected respectively with the battery cells 42 are offset from each other in the lateral direction of the circular board 72.

In the present embodiment, in each of the battery monitoring apparatuses 50, the current modulation circuit 56 causes the predetermined AC signal (i.e., sine-wave signal) to be outputted from the corresponding battery cell 42 through the first electrical path 81. Upon output of the AC signal, an electromotive force is induced in the pair of second electrical paths 82 by the AC signal. However, the response signal flowing through the pair of second electrical paths 82 is a very weak signal. Therefore, the response signal may be affected by the induced electromotive force in the pair of second electrical paths 82, resulting in an error in the measurement of the complex impedance of the corresponding battery cell 42.

To solve the above problem, in the present embodiment, the battery monitoring apparatuses 50 are configured to reduce the induced electromotive force in the second electrical paths 82.

Hereinafter, for the sake of facilitating understanding, the cause of occurrence of the induced electromotive force and the principle of suppressing the induced electromotive force will be explained before describing the configuration of the battery monitoring apparatuses 50 for reducing the induced electromotive force.

Figure 5A:
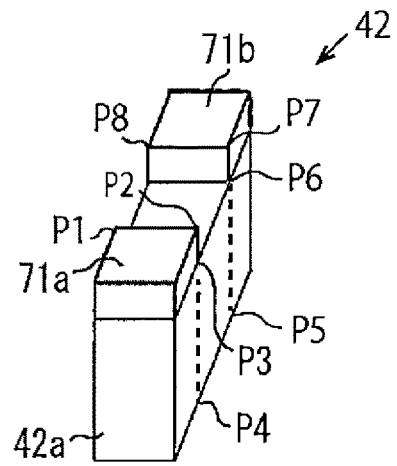
FIG. 5A is a schematic diagram illustrating a model of a battery cell.
Figure 5B:
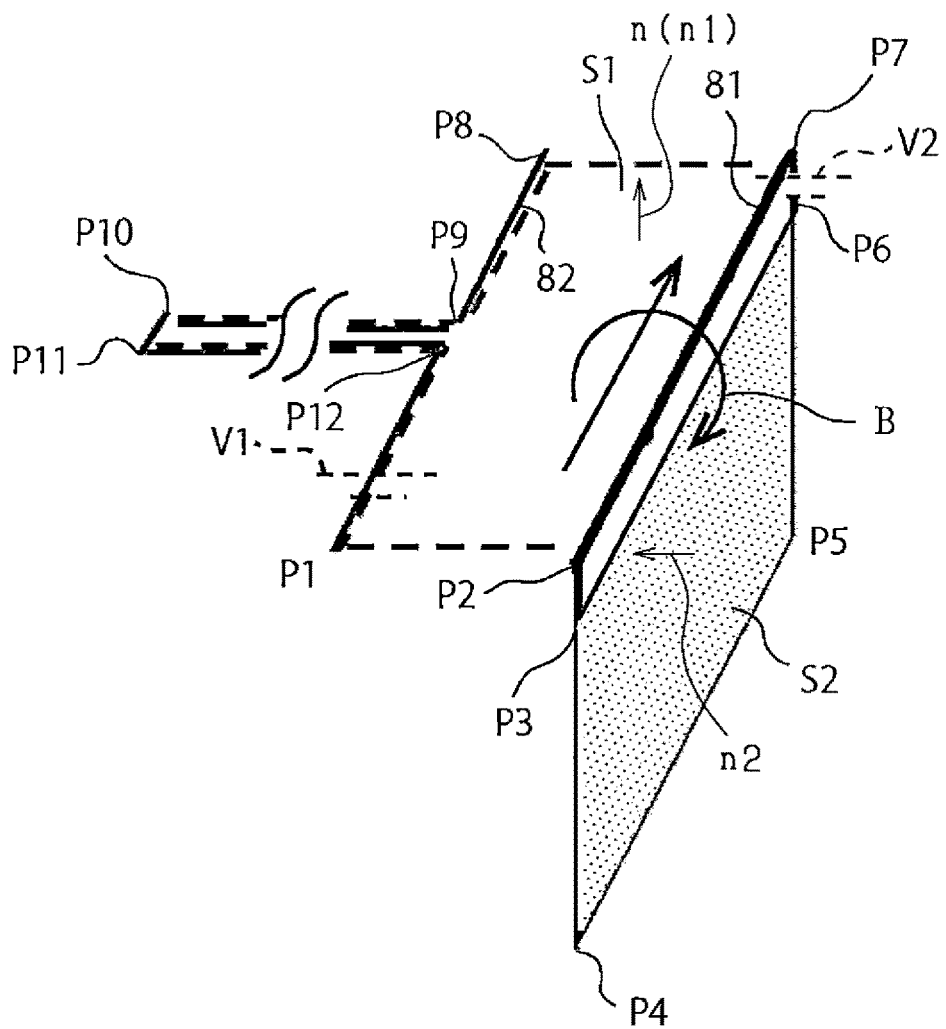
FIG. 5B is a schematic diagram illustrating electrical paths connected with the battery cell illustrated in FIG. 5A and electrical paths formed in the battery cell.

FIG. 5A illustrates a model of a battery cell 42. FIG. 5B illustrates the first and second electrical paths 81 and 82 connected with the battery cell 42 and electrical paths (or current paths) formed in the battery cell 42. In addition, points P1-P12 in FIG. 5A respectively correspond to points P1-P12 in FIG. 5B.

The following equation (1) represents Faraday's law, where E is the electrical field, L is the length of the path of the line integral (i.e., the path along which the line integral is calculated), B is the magnetic flux density vector, S is the area of the region surrounded by the path of the line integral on the left side, and n is the normal vector of S. In addition, the electrical field E and the magnetic flux density vector B are parameters dependent on both location and time.

$$\oint_L E \cdot dL = -\int_S \frac{\partial}{\partial t} B \cdot n dS \quad (1)$$

According to Faraday's law, it is only necessary that the electrical field is present on the path of the line integral on the left side of the equation (1); and it is not necessary for the path of the line integral to be closed by the electrical conductor members, i.e., by the electrical paths. Therefore, the path of the line integral on the left side of the equation (1) can be represented by a path that sequentially connects the points P1-P2. In addition, it is assumed that the points P1-P12 are connected with straight lines.

In FIGS. 5A and 5B, the points P10 and P11 respectively represent the positions of the two response signal input terminals 58 corresponding to the battery cell 42. The points P9 and P12 respectively represent the positions where the second electrical paths 82 are respectively bent (see also FIG. 4). The points P1 and P8 respectively represent the positions where the second electrical paths 82 are respectively joined to the electric power supply terminals 71 (i.e., the positive-electrode-side and negative-electrode-side electric power supply terminals 71a and 71b) of the battery cell 42. The points P2 and P7 respectively represent the positions where opposite end portions of the first electrical path 81 are respectively joined to the electric power supply terminals 71 of the battery cell 42. That is, in FIG. 5B, the straight line connecting the points P2 and P7 represents the first electrical path 81.

Moreover, in FIGS. 5A and 5B, the point P3 is a point which is on the straight line extending through the point P2 and perpendicular to both the straight line connecting the points P2 and P7 and the straight line connecting the points P1 and P2 and which represents the position of a lower end of an exposed portion of the positive-electrode-side electric power supply terminal 71a of the battery cell 42. The exposed portion of the positive-electrode-side electric power supply terminal 71a is exposed from the receiving case 42a of the battery cell 42. The point P4 is the intersection point between the lower end face (or bottom face) of the battery cell 42 and the straight line that extends through both the points P2 and P3 and perpendicular to both the straight line connecting the points P2 and P7 and the straight line connecting the points P1 and P2. Similarly, the point P6 is a point which is on the straight line extending through the point P7 and perpendicular to both the straight line connecting the points P2 and P7 and the straight line connecting the points P7 and P8 and which represents the position of a lower end of an exposed portion of the negative-electrode-side electric power supply terminal 71b of the battery cell 42. The exposed portion of the negative-electrode-side electric power supply terminal 71b is exposed from the receiving case 42a of the battery cell 42. The point P5 is the intersection point between the lower end face of the battery cell 42 and the straight line that extends through both the points P6 and P7 and perpendicular to both the straight line connecting the points P2 and P7 and the straight line connecting the points P7 and P8. In addition, in FIG. 5B, the portion shown with dots represents the inside of the battery cell 42 (more specifically, the inside of the receiving case 42a of the battery cell 42).

The flow of electric current within the receiving case 42a of the battery cell 42 depends on the structure of the electrodes and is thus complicated. However, magnetic flux generated by the electric current flowing within the receiving case 42a of the battery cell 42 would be canceled by eddy current generated on the surfaces of the receiving case 42a (in other words, by the shield effect of the receiving case 42). Therefore, assuming that electric current flows along the first electrical path 81 from the point P2 to the point P7, the flow of the electric current within the receiving case 42a can be simplified as flowing through the point P6→point P5→point P4→point P3. It should be noted that: the electric current flowing through the first electrical path 81 is the predetermined AC signal; and the flow of the electric current is thus not unidirectional, but bidirectional.

As shown in FIG. 5B, when the electric current flows along the first electrical path 81 from the point P2 to the point P7, the magnetic flux density vector B is created clockwise. Consequently, an electromotive force V1 (designated by dashed lines in FIG. 5B) will be induced in the electrical path extending through the point P7→point P8→point P9→point P10→point P11→point P12→point P1→point P2, i.e., induced in the pair of second electrical paths 82 so as to cause the electric potential at the point P7 to become higher than the electric potential at the point P2.

At the same time, an electromotive force V2 (designated by dashed lines in FIG. 5B) will be induced in the electrical path extending through the point P7→point P6→point P5→point P4→point P3→point P2, i.e., induced in the battery cell 42 so as to cause the electric potential at the point P7 to become higher than the electric potential at the point P2. That is, the electromotive force V1 and the electromotive force V2 are induced so as to cancel each other.

Moreover, in view of the fact that the right side of the equation (1) represents the change with time of the magnetic flux, the product of the magnetic flux density vector B and the normal vector n is taken into account as follows. Here, it is assumed that with respect to the first electrical path 81 through which the predetermined AC signal flows, an outward direction from the inside of the battery cell 42 is defined as a positive direction of the normal vector n.

As shown in FIG. 5B, when the electric current flows along the first electrical path 81 from the point P2 to the point P7, the product (φ1) of the magnetic flux density vector B and the normal vector n1 of a first region S1 defined on the circuit board 72 becomes positive; the first region S1 is surrounded by the electrical path extending through the point P1→point P2→point P7→point P8→point P9→point P10→point P11→point P12→point P1. In addition, the first region 51 can be regarded as a region which is surrounded by the first electrical path 81, the pair of second electrical paths 82, and the positive-electrode-side and negative-electrode-side electric power supply terminals 71a and 71 of the battery cell 42.

At the same time, the product (φ2) of the magnetic flux density vector B and the normal vector n2 of a second region S2 defined in the battery cell 42 becomes negative; the second region S2 is surrounded by the electrical path extending through the point P2→point P3→point P4→point P5→point P6→point P7→point P2. From the above, it is clear that the product (φ1) of the magnetic flux density vector B and the normal vector n1 and the product (φ2) of the magnetic flux density vector B and the normal vector n2 have an opposite positive/negative relationship to each other.

Furthermore, in the present embodiment, the equation (1) can be reformulated as the following equation (2), where S1 is the area of the first region S1 and S2 is the area of the second region S2.

$$\oint_L E \cdot dL = -\left[\frac{\partial}{\partial t}\int_{S1} B \cdot n1 dS1 + \frac{\partial}{\partial t}\int_{S2} B \cdot n2 dS2\right] \quad (2)$$

In addition, the left sides of the equations (1) and (2) represent the total induced electromotive force. From the equation (2), it is clear that the total induced electromotive force is equal to the sum of the result of partial-differentiating the surface integral of the magnetic flux density vector B over the first region S1 (i.e., the magnetic flux through the first region S1) with respect to time t and the result of partial-differentiating the surface integral of the magnetic flux density vector B over the second region S2 (i.e., the magnetic flux through the second region S2) with respect to time t.

The design specification of the battery cells 42 is generally predetermined. Therefore, it is difficult to change the configuration (i.e., the shape of the receiving case 42a, the arrangement and shape of the electrodes, the arrangement and shape of the electric power supply terminals 71, and so on) of the battery cells 42. In view of the above, in the present embodiment, the size (or area) of the first region S1 is set to have the induced electromotive force, which is induced in the pair of second electrical paths 82 by the predetermined AC signal flowing through the first electrical path 81, be within an allowable electromotive-force range which includes zero.

Figure 6:
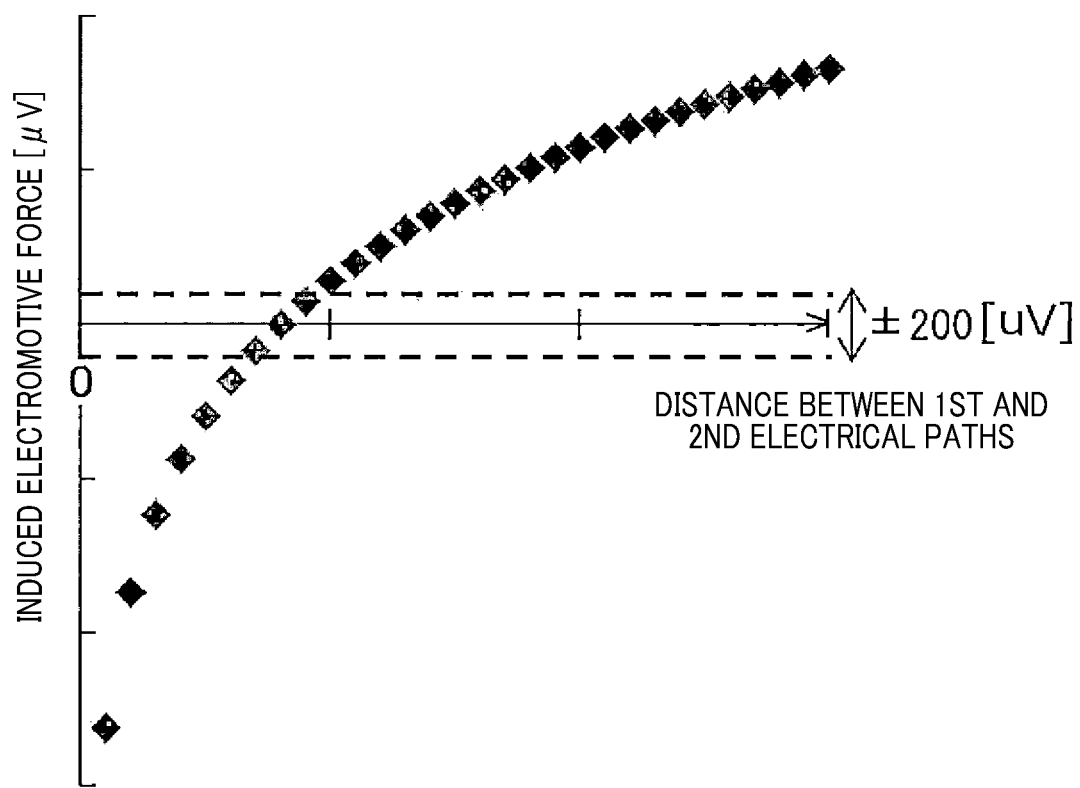
FIG. 6 is a graph illustrating the relationship between an induced electromotive force, which is induced in a pair of second electrical paths by an AC signal flowing through a first electrical path, and the distance between the first electrical path and the pair of second electrical paths.

More specifically, the inventors of the present application have found, through experimental investigation, that the induced electromotive force changes with the distance between the first electrical path 81 and the pair of second electrical paths 82, as shown in FIG. 6. In addition, in FIG. 6, the horizontal axis represents the distance between the first electrical path 81 and the pair of second electrical paths 82; and the vertical axis represents the magnitude of the induced electromotive force.

In the present embodiment, the size of the first region S1 is set by adjusting the distance between the first electrical path 81 and the pair of second electrical paths 82, so as to have the induced electromotive force be within the allowable electromotive-force range.

The allowable electromotive-force range may be set based on, for example, the accuracy of calculation of the complex impedance of the battery cell 42 and the amplitudes of the response signal and noise signals. More particularly, in the present embodiment, the allowable electromotive-force range is set to be a range of ±200 μV centering on zero (see FIG. 6). In other words, the allowable electromotive-force range is set to be from −200 μV to 200 μV.

In addition, in the case where it is possible to determine the second region S2 surrounded by the first electrical path 81 and the receiving case 42a of the battery cell 42, the size of the first region S1 may be set according to the second region S2 to have the difference between a first magnetic flux and a second magnetic flux be within an allowable magnetic-flux-difference range which includes zero. Here, the first magnetic flux denotes the magnetic flux which is generated by the predetermined AC signal to flow through the first region S1; and the second magnetic flux denotes the magnetic flux which is generated by the predetermined AC signal to flow through the second region S2. With this configuration, it is possible to suppress the induced electromotive force in the pair of second electrical paths 82. In addition, the allowable magnetic-flux-difference range may be set based on, for example, the accuracy of calculation of the complex impedance of the battery cell 42 and the amplitudes of the response signal and noise signals.

According to the present embodiment, it is possible to achieve the following advantageous effects.

In each of the battery monitoring apparatuses 50 according to the present embodiment, the size (or area) of the first region S1 is set to have the induced electromotive force, which is induced in the pair of second electrical paths 82 by the predetermined AC signal flowing through the first electrical path 81, be within the allowable electromotive-force range which includes zero. More specifically, the size of the first region S1 is set by adjusting the distance between the first electrical path 81 and the pair of second electrical paths 82. Consequently, when the predetermined AC signal is outputted from the battery cell 42 through the first electrical path 81, it will be possible to prevent a high electromotive force from being induced in the pair of second electrical paths 82 by a magnetic flux change due to the AC signal. As a result, it becomes possible to suppress occurrence of an error in detection of the response signal, thereby improving the accuracy of calculating the complex impedance of the battery cell 42 based on the detected response signal.

Moreover, in each of the battery monitoring apparatuses 50 according to the present embodiment, the current modulation circuit 56 includes the semiconductor switch element 56a to function as the signal control unit. The ASIC 50a includes the input/output unit 52 that functions as the response signal input unit, and the microcomputer 53 that functions as the calculating unit. All of the current modulation circuit 56, the ASIC 50a, the first electrical path 81 and the pair of second electrical paths 82 are located on the same plane. Consequently, it becomes possible to suppress, based on the above-described principle, the induced electromotive force by adjusting the size of the first region S1 that is surrounded by the first electrical path 81 and the pair of second electrical paths 82. Furthermore, the ASIC 50a is arranged on an end portion (i.e., right end portion in FIG. 4) of the circuit board 72. Consequently, the distance from the first electrical path 81 to the ASIC 50a is increased in comparison with the case of arranging the ASIC 50a between the positive-electrode-side and negative-electrode-side electric power supply terminals 71a and 71b of the battery cell 42. As a result, it becomes difficult for the ASIC 50a to be affected by the magnetic flux density vector created by the predetermined AC signal flowing through the first electrical path 81.

In each of the battery monitoring apparatuses 50 according to the present embodiment, the current modulation circuit 56 is configured to cause the sine-wave signal (or predetermined AC signal) to be outputted from the battery cell 42 that is the monitoring target, with the battery cell 42 itself being the electric power source for the output of the sine-wave signal. Consequently, it becomes unnecessary to employ an external electric power source for applying a disturbance to the battery cell 42 (i.e., causing the sine-wave signal to be outputted from the battery cell 42) for the purpose of measuring the complex impedance of the battery cell 42. As a result, it becomes possible to reduce the parts count and the size of the battery monitoring apparatuses 50, thereby lowering the manufacturing cost.

Moreover, to an in-vehicle storage battery, there are generally connected peripheral devices such as a protective element and a filter circuit. Therefore, when an AC signal is inputted as a disturbance to the storage battery, part of the AC signal may be leaked to the peripheral devices. For example, in the present embodiment, to each of the battery cells 42, there are connected the RC filters 55a and the Zener diode 55b. Therefore, if an AC signal is inputted to the battery cell 42, part of the AC signal might be leaked to the RC filters 55a and the Zener diode 55b. Consequently, if the complex impedance of the battery cell 42 was calculated based on a response signal of the battery cell 42 to the inputted AC signal, it might be impossible to ensure the accuracy of calculation of the complex impedance due to an error in the response signal caused by the leakage of the AC signal.

In contrast, in the present embodiment, as described above, the current modulation circuit 56 is configured to cause the sine-wave signal to be outputted from the battery cell 42 that is the monitoring target, with the battery cell 42 itself being the electric power source for the output of the sine-wave signal. Consequently, it becomes possible to realize a closed circuit with the current modulation circuit 56 and the battery cell 42. As a result, it becomes possible to eliminate current leakage from the battery cell 42 to the peripheral devices, thereby suppressing occurrence of an error in the response signal.

Moreover, a deviation may occur between the current signal actually flowing through the resistor 56b and the sine-wave signal desired to be outputted from the battery cell 42; this deviation may cause an error in the response signal. In view of the above, in the present embodiment, the current modulation circuit 56 is configured to include the feedback circuit 56d. The feedback circuit 56d performs, based on comparison between the feedback signal (i.e., the detected signal) and the sine-wave signal commanded by the command signal, a feedback control for the on/off operation of the semiconductor switch element 56a. Consequently, it becomes possible to have the commanded (or desired) sine-wave signal stably and accurately outputted from the battery cell 42.

In the present embodiment, in commanding the waveform of the sine-wave signal to the current modulation circuit 56 by the command signal, the digital-to-analog conversion is performed for the command signal. However, an error may occur in the waveform of the command signal during the digital-to-analog conversion. For suppressing occurrence of such an error, a filter circuit may be provided between the input/output unit 52 and the current modulation circuit 56 to smooth the waveform of the command signal. However, in this case, the size and manufacturing cost of the battery monitoring apparatus 50 would be increased.

In particular, the capacity of a vehicular battery cell 42 is generally large. Therefore, the range of measurement frequencies in calculation (or measurement) of the complex impedance of the battery cell 42 tends to become wide. Accordingly, if a filter circuit was provided between the input/output unit 52 and the current modulation circuit 56 to smooth the waveform of the command signal, the size of the filter circuit would also become large.

In contrast, in the present embodiment, as described above, the feedback circuit 56d performs the feedback control for the on/off operation of the semiconductor switch element 56a, thereby suppressing occurrence of an error in the waveform of the command signal. Consequently, it becomes unnecessary to provide a filter circuit between the input/output unit 52 and the current modulation circuit 56.

In the present embodiment, the current modulation circuit 56 is configured to detect the current signal flowing through the resistor 56b and output the detected current signal as the feedback signal to the microcomputer 53 via the input/output unit 52. Then, the microcomputer 53 calculates the complex impedance of the battery cell 42 using the feedback signal as the current signal. Consequently, when there is a deviation (e.g., a phase deviation) between the current signal actually flowing through the resistor 56b and the sine-wave signal desired to be outputted from the battery cell 42 (i.e., the sine-wave signal commanded by the microcomputer 53), it is still possible to ensure the accuracy of calculation of the complex impedance by using the feedback signal (i.e., the current signal actually flowing through the resistor 56b).

Moreover, since the signal correction is performed with the feedback signal as described above, it becomes unnecessary to provide a filter circuit between the input/output unit 52 and the current modulation circuit 56. Consequently, it becomes possible to minimize the size and manufacturing cost of the battery monitoring apparatus 50.

In the present embodiment, the response signal input terminals 58 are connected respectively to, of all connectable portions of the electric power supply terminals 71a and 71b of the battery cell 42, those connectable portions which are located closest to the electrodes of the battery cell 42. Consequently, it becomes possible to suppress the influence of impedance components of the electric power supply terminals 71a and 71b of the battery cell 42 on the response signal inputted to the battery monitoring apparatus 50 via the response signal input terminals 58, thereby improving the accuracy of calculation of the complex impedance of the battery cell 42.

More specifically, as illustrated in FIGS. 7A and 7B, the electric power supply terminals 71a and 71b of the battery cell 42 have impedance components. Therefore, it is preferable for the response signal input terminals 58 to be connected respectively to those connectable portions of the electric power supply terminals 71a and 71b which are located closer to the electrodes as shown in FIG. 7B than those connectable portions which are located further from the electrodes as shown in FIG. 7A. In addition, as shown in FIG. 7B, it is preferable that those connectable portions of the electric power supply terminals 71a and 71b to which the response signal input terminals 58 are respectively connected are located closer to the electrodes than those connectable portions to which terminals of the current modulation circuit 56 are respectively connected are.

Second Embodiment

Battery monitoring apparatuses 50 according to the second embodiment has a similar configuration to the battery monitoring apparatuses 50 according to the first embodiment. Therefore, the differences therebetween will be mainly described hereinafter.

Figure 8A:
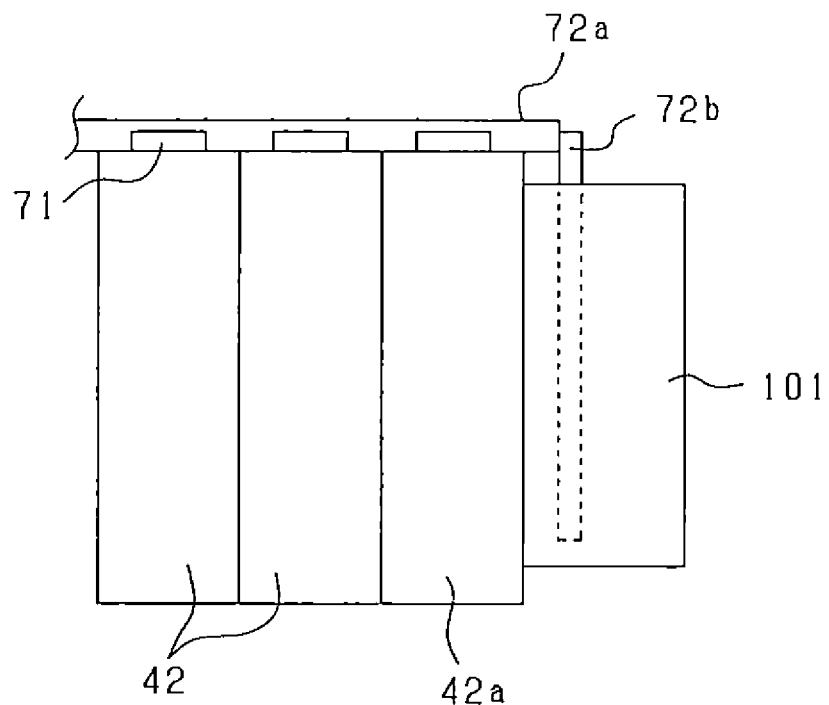
FIG. 8A is a side view illustrating the configuration of a circuit board and a tubular member of a battery monitoring apparatus according to a second embodiment.
Figure 8B:
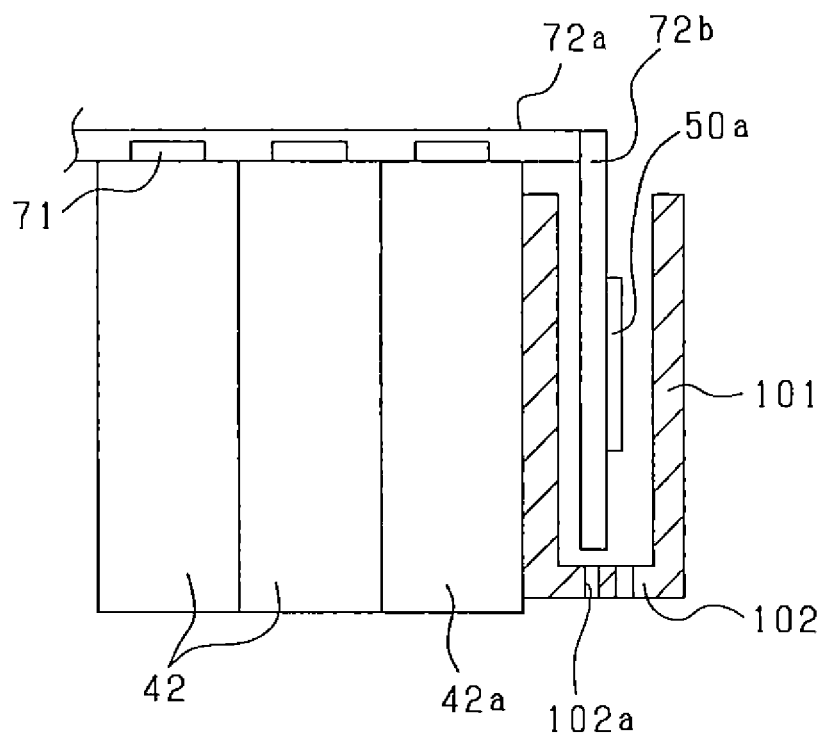
FIG. 8B is a partially cross-sectional view illustrating the configuration of the circuit board and the tubular member.

As shown in FIGS. 8A and 8B, in the second embodiment, the circuit board 72 is bent at an end portion thereof in the longitudinal direction of the circuit board 72 (or the stacking direction of the battery cells 42). Consequently, the circuit board 72 has both a first part 72a and a second part 72b. The first part 72a is arranged between the electric power supply terminals 71 of each of the battery cells 42 to face the upper end faces of the battery cells 42 on which the electric power supply terminals 71 of the battery cells 42 are respectively provided. On the other hand, the second part 72b is arranged to be perpendicular to the first part 72*a*, i.e., parallel to side faces of the battery cells 42. That is, the second part 72*b* is opposed to the side faces of the battery cells 42. On the second part 72*b*, there are provided the ASIC 50*a* and part of each of the second electrical paths 82. Hereinafter, the first and second parts 72*a* and 72*b* of the circuit board 72 will be respectively referred to as the first circuit board 72*a* and the second circuit board 72*b*.

In addition, the circuit board 72 may be implemented by a single FPC (Flexible Printed Circuit) that is bent to have first and second parts extending perpendicular to each other. In this case, the first and second parts of the single FPC respectively constitute the first and second circuit boards 72*a* and 72*b* that are formed integrally with each other. As an alternative, the circuit board 72 may be implemented by two circuit boards that are formed separately from each other and connected both mechanically and electrically with each other by, for example, a connector and/or an FPC. In this case, the two circuit boards respectively constitute the first and second circuit boards 72*a* and 72*b*.

In the present embodiment, the ASIC 50*a* and those parts of the second electrical paths 82 which are provided on the second circuit board 72*b* are located on a different plane from the first electrical paths 81 and the current modulation circuits 56 of the battery monitoring apparatuses 50 that are provided on the first circuit board 72*a*. Consequently, the ASIC 50*a* and those parts of the second electrical paths 82 which are provided on the second circuit board 72*b* will be affected, in a different manner from the case of the ASIC 50*a* and the entire second electrical paths 82 being located on the same plane as the first electrical paths 81 and the current modulation circuits 56, by the magnetic flux density vector created by the predetermined AC signal.

In view of the above, in the present embodiment, there is provided, as a shield member, a tubular member 101 to surround the second circuit board 72*b*. The tubular member 101 is formed of an electrically conductive material, such as an electrically conductive metal, resin or carbon, into the shape of a rectangular tube. The second circuit board 72*b* is received in the tubular member 101. Consequently, it becomes possible to suppress the influence of the magnetic flux density vector created by the predetermined AC signal on the ASIC 50*a*; it also becomes possible to suppress the influence of external magnetic fields on the ASIC 50*a*. As a result, it becomes possible to improve the accuracy of calculation of the complex impedance of each of the battery cells 42.

Moreover, with the second circuit board 72*b* provided to be perpendicular to the first circuit board 72*a*, it becomes possible to reduce the length of the entire circuit board 72 in the stacking direction of the battery cells 42 in comparison with the case of both the first and second circuit boards 72*a* and 72*b* being provided on the same plane. In addition, with the second circuit board 72*b* opposed to the side faces of the battery cells 42, it becomes possible to minimize the size of the entire assembly of the battery cells 42 and the corresponding battery monitoring apparatuses 50.

Furthermore, as shown in FIG. 8B, the tubular member 101 has an open end on the upper side (i.e., the side where the electric power supply terminals 71 of the battery cells 42 are located) and a bottom wall 102 on the lower side (i.e., the side where the lower end faces of the battery cells 42 are located). In the bottom wall 102, there is formed a through-hole 102*a* to penetrate the bottom wall 102 in the vertical direction (i.e., the height direction of the battery cells 42). Consequently, with the through-hole 102*a*, it becomes possible for cooling air to flow through the inside of the tubular member 101. As a result, it becomes possible to effectively dissipate heat generated by the ASIC 50*a* provided on the second circuit board 72*b*.

In addition, in the present embodiment, the tubular member 101 is formed separately from the receiving cases 42*a* of the battery cells 42. However, the tubular member 101 may alternatively be formed integrally with at least one of the receiving cases 42*a* of the battery cells 42. For example, the tubular member 101 may be formed integrally with one of the receiving cases 42*a* of the battery cells 42 to share a side wall with the receiving case 42*a*. As another alternative, the tubular member 101 may be formed integrally with a receiving case (or power supply case) of the entire battery back 40 to share a side wall with the receiving case.

Third Embodiment

Battery monitoring apparatuses 50 according to the third embodiment has a similar configuration to the battery monitoring apparatuses 50 according to the first embodiment. Therefore, the differences therebetween will be mainly described hereinafter.

In the first embodiment, in each of the battery monitoring apparatuses 50, the size (or area) of the first region S1 is set by adjusting the distance between the first electrical path 81 and the pair of second electrical paths 82, so as to have the induced electromotive force be within the allowable electromotive-force range.

However, on the circuit board 72, there are arranged various circuit elements and electrical paths. Therefore, it is not always possible to arbitrary set the size of the first region S1.

In view of the above, in the present embodiment, an electrically conductive member is arranged within the first region S1 on the circuit board 72.

Figure 9:
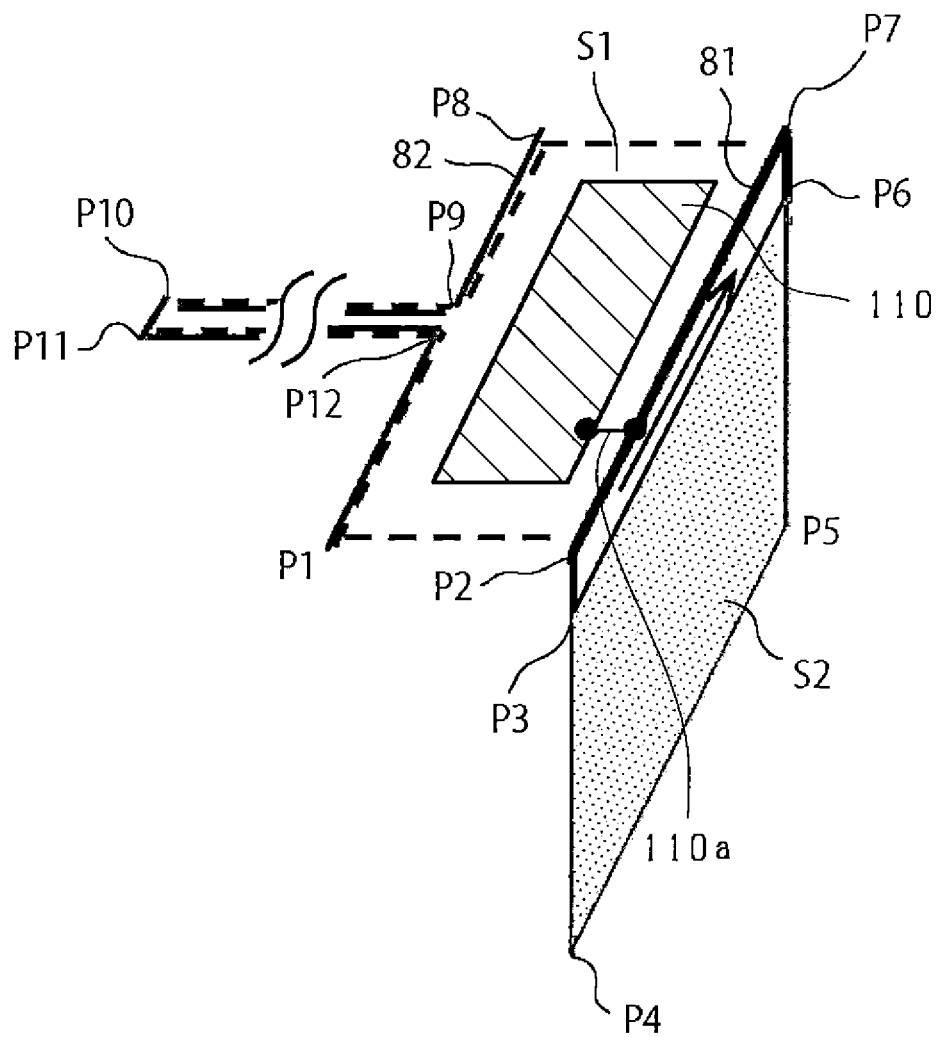
FIG. 9 is a schematic diagram illustrating a shield plate arranged in a first region on a circuit board of a battery monitoring apparatus according to a third embodiment.

Specifically, as shown in FIG. 9, a shield plate 110, which is electrically conductive and shaped as a rectangular plate, is arranged within the first region S1, more specifically between the first electrical path 81 and the pair of second electrical paths 82. In addition, for the sake of facilitating understanding, the shield plate 110 is hatched in FIG. 9.

The shield plate 110 is formed of an electrically conductive material. Moreover, the shield plate 110 is electrically connected with the first electrical path 81 so as to have the same electric potential as the first electrical path 81. More specifically, between the shield plate 110 and the first electrical path 81, there is connected a signal line 110*a*. No electric current is allowed to flow from the first electrical path 81 to the shield plate 110.

The shield plate 110 blocks the magnetic flux density vector B created by the predetermined AC signal from passing through it. Therefore, with the shield plate 110 arranged within the first region S1, the effective area of the first region S1 through which the magnetic flux density vector B created by the predetermined AC signal actually passes is reduced substantially by the area of the shield plate 110.

Accordingly, in the present embodiment, both the size of the shield plate 110 and the distance between the first electrical path 81 and the pair of second electrical paths 82 are adjusted so as to have the induced electromotive force be within the allowable electromotive-force range.

Consequently, when it is difficult to arbitrarily adjust the distance between the first electrical path 81 and the pair of second electrical paths 82, it will still be possible to have the induced electromotive force be within the allowable electromotive-force range by adjusting the size of the shield plate 110.

The signal line 110a may have a resistance such that the electric potential of the shield plate 110 can be kept stable. Moreover, the shield plate 110 may alternatively be connected with either of the second electrical paths 82 via a signal line. Furthermore, the shield plate 110 may alternatively have other shapes than the rectangular shape. For example, the shield plate 110 may alternatively be doughnut-shaped or mesh-shaped to have one or more holes formed therein. In addition, the shield plate 110 may be formed of a pattern or a seal-like electrical conductor provided on the circuit board 72.

Fourth Embodiment

Figure 10:
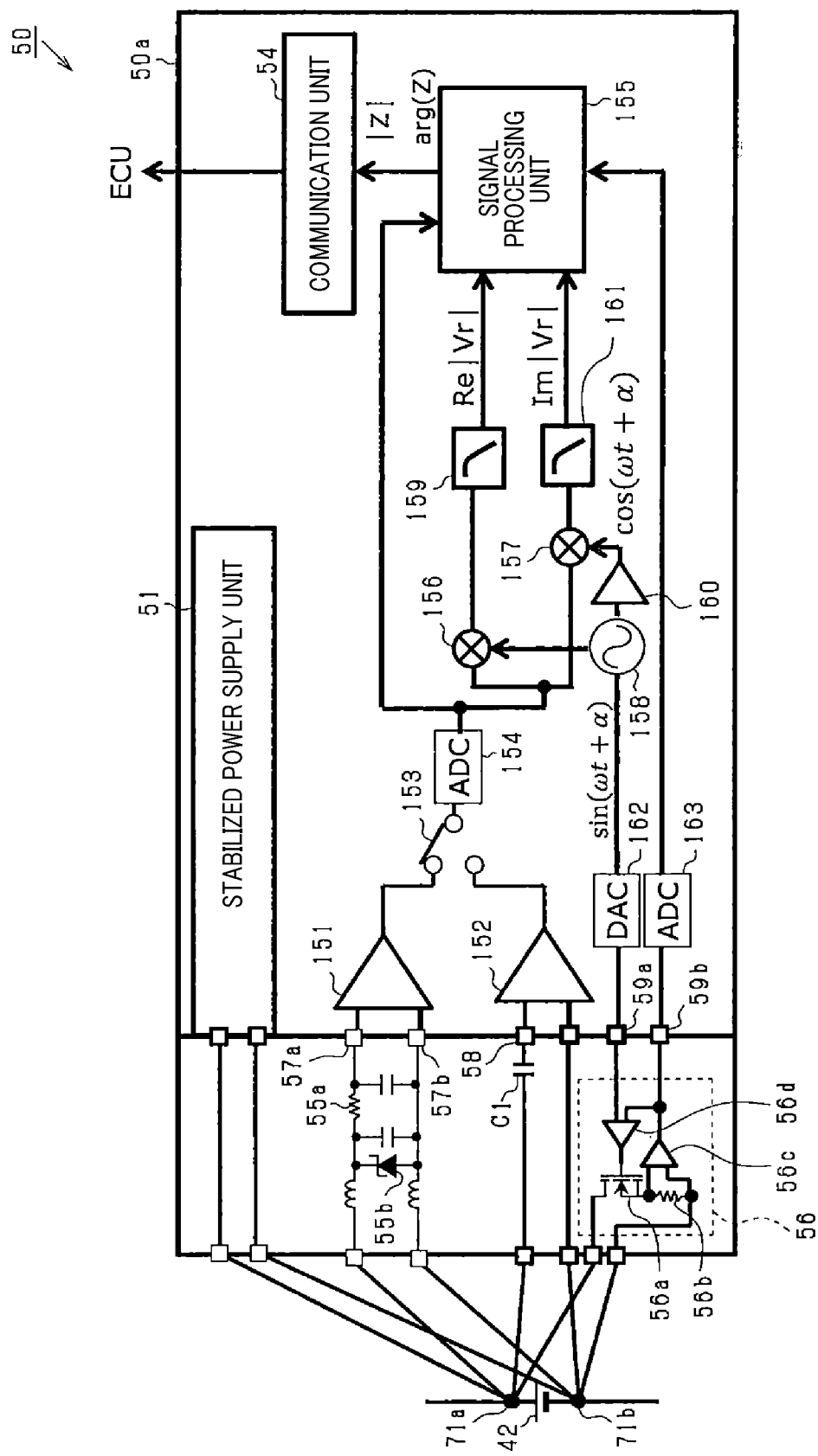
FIG. 10 is a configuration diagram of a battery monitoring apparatus according to a fourth embodiment.

FIG. 10 shows the configuration of a battery monitoring apparatus 50 according to the fourth embodiment, which is configured to perform two-phase lock-in detection on the response signal.

As shown in FIG. 10, in the present embodiment, the ASIC 50a of the battery monitoring apparatus 50 includes a differential amplifier 151 provided to measure the DC voltage between the terminals of a battery cell 42 that is the monitoring target. Specifically, the differential amplifier 151 is connected with the DC voltage input terminals 57 (i.e., the positive-electrode-side input terminal 57a and the negative-electrode-side input terminal 57b). Moreover, the differential amplifier 151 is configured to measure the DC voltage inputted thereto via the DC voltage input terminals 57 and output the measured DC voltage.

In the present embodiment, the ASIC 50a also includes a preamplifier 152 provided to input, via the response signal input terminals 58, voltage variation of the battery cell 42 as the response signal during the output of the sine-wave signal. Specifically, the preamplifier 152 is connected with the response signal input terminals 58. Moreover, the preamplifier 152 is configured to amplify the voltage variation inputted thereto via the response signal input terminals 58 and output the amplified voltage variation as the response signal. That is, the amplitude of the response signal is considerably lower than the amplitude of the terminal voltage (i.e., voltage between the terminals) of the battery cell 42; therefore, the preamplifier 152 is employed to improve the accuracy of detecting the response signal.

In addition, in the present embodiment, the preamplifier 152 is implemented by a single-stage amplifier. However, it should be noted that the preamplifier 152 may alternatively be implemented by a multi-stage amplifier.

Moreover, in the present embodiment, as shown in FIG. 10, between the positive-electrode-side electric power supply terminal 71a of the battery cell 42 and the positive-electrode-side response signal input terminal 58 (or a positive-electrode-side terminal of the preamplifier 152), there is provided a capacitor C1 to cut off a DC component of the voltage variation of the battery cell 42. Consequently, it becomes possible to remove the DC component, which is irrelevant to the internal complex impedance information of the battery cell 42, from the voltage variation of the battery cell 42, thereby improving the accuracy of detecting the response signal.

In the present embodiment, the ASIC 50a further includes a signal switch 153 to select between the DC voltage outputted from the differential amplifier 151 and the response signal outputted from the preamplifier 152. Moreover, to the signal switch 153, there is connected an AD converter 154 to perform an analog-to-digital conversion for that one of the DC voltage and the response signal which is selected by the signal switch 153.

The AD converter 154 is connected with a signal processing unit 155 that functions as a calculating unit in the fourth embodiment. The AD converter 154 is configured to input the DC voltage to the signal processing unit 155 when the DC voltage is selected by the signal switch 153. Moreover, the AD converter 154 is also connected with both a first multiplier 156 and a second multiplier 157. The AD converter 154 is configured to input the response signal to each of the first and second multipliers 156 and 157 when the response signal is selected by the signal switch 153.

To the first multiplier 156, there is connected an oscillating circuit 158 which will be described later. A first reference signal is inputted from oscillating circuit 158 to the first multiplier 156. Then, the first multiplier 156 calculates a value proportional to the real part of the response signal by multiplying the first reference signal and the response signal together. Thereafter, the first multiplier 156 outputs the value proportional to the real part of the response signal to the signal processing unit 155 via a low-pass filter 159. In addition, in FIG. 10, the real part of the response signal is denoted by Re|Vr|.

To the second multiplier 157, there is connected the oscillating circuit 158 via a phase-shift circuit 160. A second reference signal is inputted from the phase-shift circuit 160 to the second multiplier 157; the second reference signal is produced by the phase-shift circuit 160 by advancing the phase of the first reference signal by 90° (i.e., π/2). More specifically, the phase-shift circuit 160 is configured to advance the phase of a sine-wave signal (i.e., the first reference signal) inputted thereto from the oscillating circuit 158 and output the phase-advanced sine-wave signal as the second reference signal to the second multiplier 157.

The second multiplier 157 calculates a value proportional to the imaginary part of the response signal by multiplying the second reference signal and the response signal together. Then, the second multiplier 157 outputs the value proportional to the imaginary part of the response signal to the signal processing unit 155 via a low-pass filter 161. In addition, in FIG. 10, the imaginary part of the response signal is denoted by Im|Vr|.

The oscillating circuit 158 is configured to output the predetermined sine-wave signal and functions as a waveform commanding unit. As described above, the oscillating circuit 158 outputs the sine-wave signal as the first reference signal to both the first multiplier 156 and the phase-shift circuit 160. Moreover, the oscillating circuit 158 is connected with the command signal output terminal 59a via a DA converter 162. The oscillating circuit 158 outputs the sine-wave signal as the command signal to the command signal output terminal 59a through the digital-to-analog conversion by the DA converter 162.

The feedback signal input terminal 59b is connected with the signal processing unit 155 via an AD converter 163. The feedback signal (or detected signal) is inputted from the feedback signal input terminal 59b to the signal processing unit 155 through the analog-to-digital conversion by the AD converter 163.

The signal processing unit 155 receives both the value proportional to the real part of the response signal and the value proportional to the imaginary part of the response signal. Then, based on these values, the signal processing unit 155 calculates both the real and imaginary parts of the complex impedance of the battery cell 42. Moreover, based on the feedback signal inputted thereto, the signal processing unit 155 corrects both the real and imaginary parts of the complex impedance taking into account the amplitude of the current signal actually flowing through the resistor 56b and the phase difference of the current signal from the sine-wave signal commanded by the command signal.

Furthermore, the signal processing unit 155 also calculates both the absolute value and the phase of the complex impedance. More specifically, since both the real part and the imaginary part of the response signal have been detected by the two-phase lock-in detection, the response signal can be represented by $|Vr|e^{j\theta v}$ in polar coordinates on a complex plane, where $\theta v$ is the phase of the response signal. Similarly, the current can be represented by $|I|e^{j\theta i}$ in polar coordinates on the complex plane, where $\theta i$ is the phase of the current. Moreover, the complex impedance of the battery cell 42 can be represented by $|Z|e^{j\theta z}$ in polar coordinates on the complex plane, where $\theta z$ is the phase of the complex impedance. Then, the following equation (3) can be derived from V=ZI. In addition, "j" is the imaginary unit satisfying (j^2=−1).

$$|Z|e^{j\theta z} = \frac{|Vr|e^{j\theta v}}{|I|e^{j\theta i}} \quad (3)$$

The signal processing unit 155 calculates the absolute value of the complex impedance by (|Z|=|Vr|/|I|). Moreover, the signal processing unit 155 calculates the phase of the complex impedance by (θv−θi). Thereafter, the signal processing unit 155 outputs the calculation results to the ECU 60 via the communication unit 54. In addition, in FIG. 10, the absolute value and the phase of the complex impedance are respectively denoted by |Z| and arg(Z).

Figure 11:
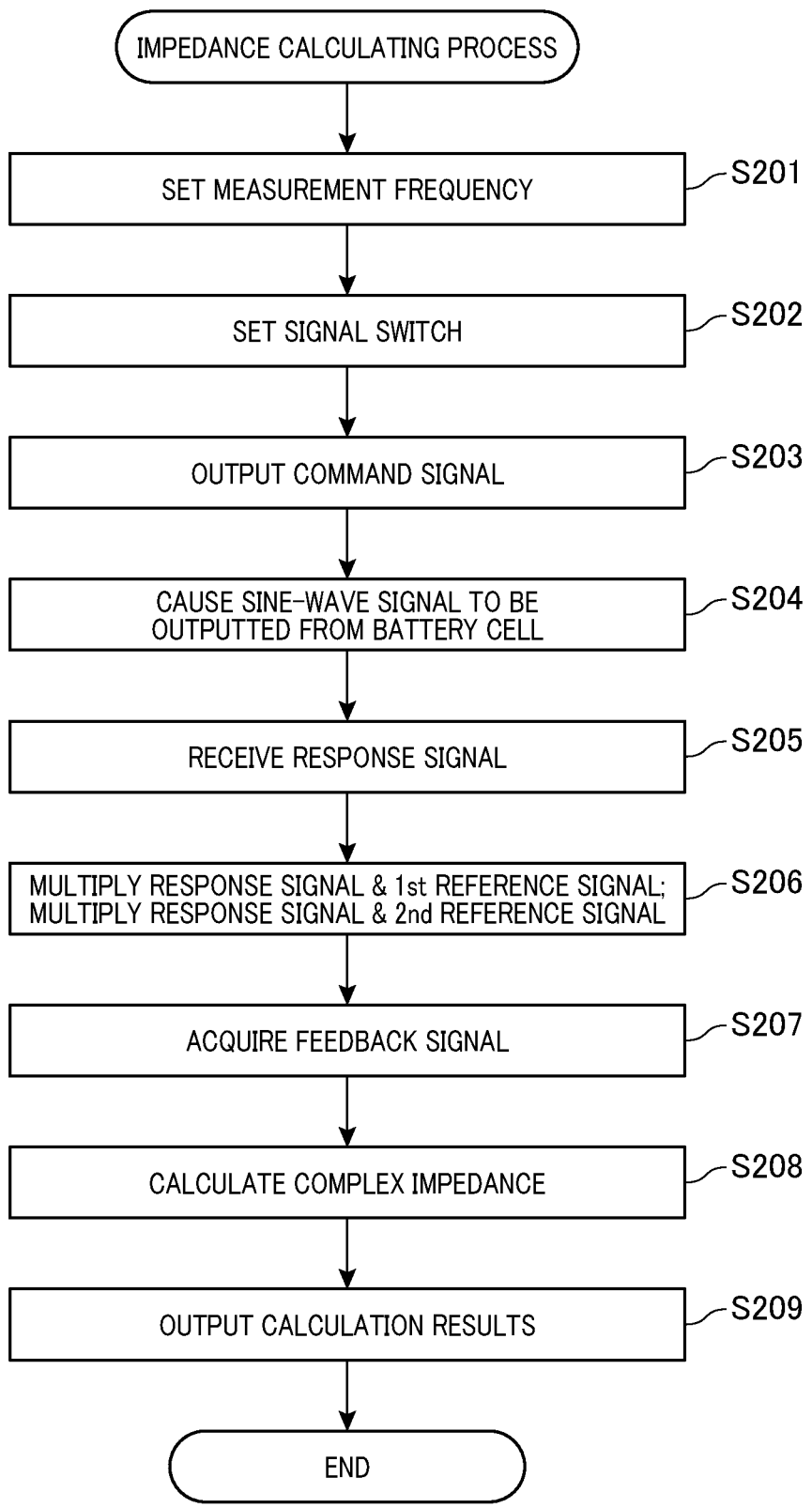
FIG. 11 is a flow chart illustrating a complex impedance calculating process according to the fourth embodiment.

Next, a process of calculating the complex impedance of a battery cell 42 according to the fourth embodiment will be described with reference to FIG. 11. This process is repeatedly performed by the battery monitoring apparatus 50 in a predetermined cycle.

In the complex impedance calculating process, first, in step S201, the oscillating circuit 158 sets a measurement frequency of the complex impedance within a predetermined frequency range. In addition, in the fourth embodiment, the measurement frequency is determined by, for example, the signal processing unit 155.

In step S202, the signal switch 153 is set to allow, of the DC voltage outputted from the differential amplifier 151 and the response signal outputted from the preamplifier 152, only the response signal to be outputted to the AD converter 154. In addition, the signal switch 153 is operated according to, for example, a command from the signal processing unit 155.

In step S203, the oscillating circuit 158 sets the frequency of the sine-wave signal (or predetermined AC signal) based on the measurement frequency set in step S201. Then, the oscillating circuit 158 outputs the command signal, through the digital-to-analog conversion by the DA converter 162, to the current modulation circuit 56 via the command signal output terminal 59a. As described previously, the command signal is indicative of a command commanding the current modulation circuit 56 to cause the sine-wave signal to be outputted from the battery cell 42. In addition, the oscillating circuit 158 outputs the command signal according to, for example, a command from the signal processing unit 155.

In the digital-to-analog conversion of the command signal by the DA converter 162, a suitable offset value (i.e., DC bias) is set taking into account the DC voltage of the battery cell 42. More specifically, the offset value is set by, for example, the signal processing unit 155. Moreover, it is desirable for the offset value to be set based on the DC voltage of the battery cell 42. In addition, the DC voltage of the battery cell 42 may be measured by the differential amplifier 151.

In step S204, according to the command signal, the current modulation circuit 56 causes the sine-wave signal to be outputted from the battery cell 42 that is the monitoring target, with the battery cell 42 itself being the electric power source for the output of the sine-wave signal. Consequently, the sine-wave signal is outputted from the battery cell 42.

Upon the sine-wave signal being outputted from the battery cell 42, in other words, upon application of a disturbance to the battery cell 42, variation occurs in the voltage between the terminals of the battery cell 42; the voltage variation is indicative of the internal complex impedance information of the battery cell 42. Then, the preamplifier 152 outputs, as the response signal, the voltage variation which is inputted to the preamplifier 152 via the response signal input terminals 58.

In addition, during the input of the voltage variation from the battery cell 42 to the response signal input terminals 58, the DC component of the voltage variation is cut off (or removed) by the capacitor C1, leaving only the characterizing part of the voltage variation. It is desirable for the size of the DC component cut off by the capacitor C1 to be adjusted based on the DC voltage of the battery cell 42. The preamplifier 152 amplifies the weak voltage variation from which the DC component has been removed, and outputs the amplified voltage variation as the response signal. It is desirable for the degree of amplification of the voltage variation by the preamplifier 152 to be adjusted based on the DC voltage of the battery cell 42.

The AD converter 154 performs the analog-to-digital conversion on the response signal which is inputted to the AD converter 154 via the signal switch 153. Then, the AD converter 154 outputs the response signal in a digital form to each of the first and second multipliers 156 and 157.

In step S205, each of the first and second multipliers 156 and 157 receives the response signal outputted from the AD converter 154.

In step S206, the first multiplier 156 calculates a value proportional to the real part of the response signal by multiplying the first reference signal (i.e., the sine-wave signal from the oscillating circuit 158) and the response signal together. At the same time, the second multiplier 157 calculates a value proportional to the imaginary part of the response signal by multiplying the second reference signal (i.e., the phase-advanced sine-wave signal from the phase-shift circuit 160) and the response signal together.

Then, the values calculated by the first and second multipliers 156 and 157 are inputted to the signal processing unit 155 respectively through the low-pass filters 159 and 161. In addition, when passing through the low-pass filters 159 and 161, signal components other than DC components are attenuated (or removed).

In step S207, the signal processing unit 155 acquires the feedback signal (or detected signal) from the feedback signal input terminal 59b. More specifically, the feedback signal is inputted from the feedback signal input terminal 59b to the signal processing unit 155 through the analog-to-digital conversion by the AD converter 163.

In step S208, the signal processing unit 155 calculates, based on the feedback signal and the signals (or values respectively proportional to the real and imaginary parts of the response signal) from the low-pass filters 159 and 161, at least one of the real part, the imaginary part, the absolute value and the phase of the complex impedance of the battery cell 42. In addition, the feedback signal is used to correct (or eliminate) any deviation in amplitude or phase between the current signal actually outputted from the battery cell 42 and the sine-wave signal desired to be outputted from the battery cell 42.

In step S209, the signal processing unit 155 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

According to the fourth embodiment, it is possible to achieve the following advantageous effects.

In the battery monitoring apparatus 50 according to the present embodiment, the signal processing unit 155 calculates a value proportional to the real part of the response signal based on the product of the response signal inputted via the response signal input terminals 58 and the first reference signal together. Moreover, the signal processing unit 155 also calculates a value proportional to the imaginary part of the response signal based on the product of the response signal and the second reference signal that is produced by shifting the phase of the sine-wave signal (i.e., the first reference signal). Then, the signal processing unit 155 calculates the complex impedance of the battery cell 42 based on the above values. Consequently, by performing the so-called lock-in detection, it becomes possible to extract, from the response signal, only a component having the same frequency as the sine-wave signal commanded by the oscillating circuit 158. Therefore, the battery monitoring apparatus 50 according to the present embodiment is tolerant to white noise and pink noise and capable of accurately calculating the complex impedance of the battery cell 42. Accordingly, the battery monitoring apparatus 50 according to the present embodiment is particularly suitable for use in a vehicle where there are generally various types of noise present. Moreover, since the battery monitoring apparatus 50 is tolerant to noise, it becomes possible to lower the current (i.e., the sine-wave signal) caused to be outputted from the battery cell 42. Consequently, it becomes possible to suppress consumption of the electric power of the battery cell 42; it also becomes possible to suppress increase in the temperatures of the battery cell 42 and the semiconductor switch element 56a of the battery monitoring apparatus 50.

Moreover, in the present embodiment, the signal processing unit 155 acquires, from the current modulation circuit 56, the feedback signal that is the detected current signal actually outputted from (or actually flowing out of) the battery cell 42. Then, the signal processing unit 155 corrects (or eliminates) any deviation in amplitude or phase between the current signal actually outputted from the battery cell 42 and the sine-wave signal commanded by the command signal. Consequently, it becomes possible to improve the accuracy of calculation of the complex impedance of the battery cell 42.

Furthermore, in the present embodiment, even if an error occurs in the waveform of the command signal during the digital-to-analog conversion by the DA converter 162, it is possible to suppress the error by the correction performed using the feedback signal. Consequently, it becomes unnecessary to provide a filter circuit between the current modulation circuit 56 and the DA converter 162. As a result, it becomes possible to minimize the size and manufacturing cost of the battery monitoring apparatus 50.

Fifth Embodiment

Figure 12:
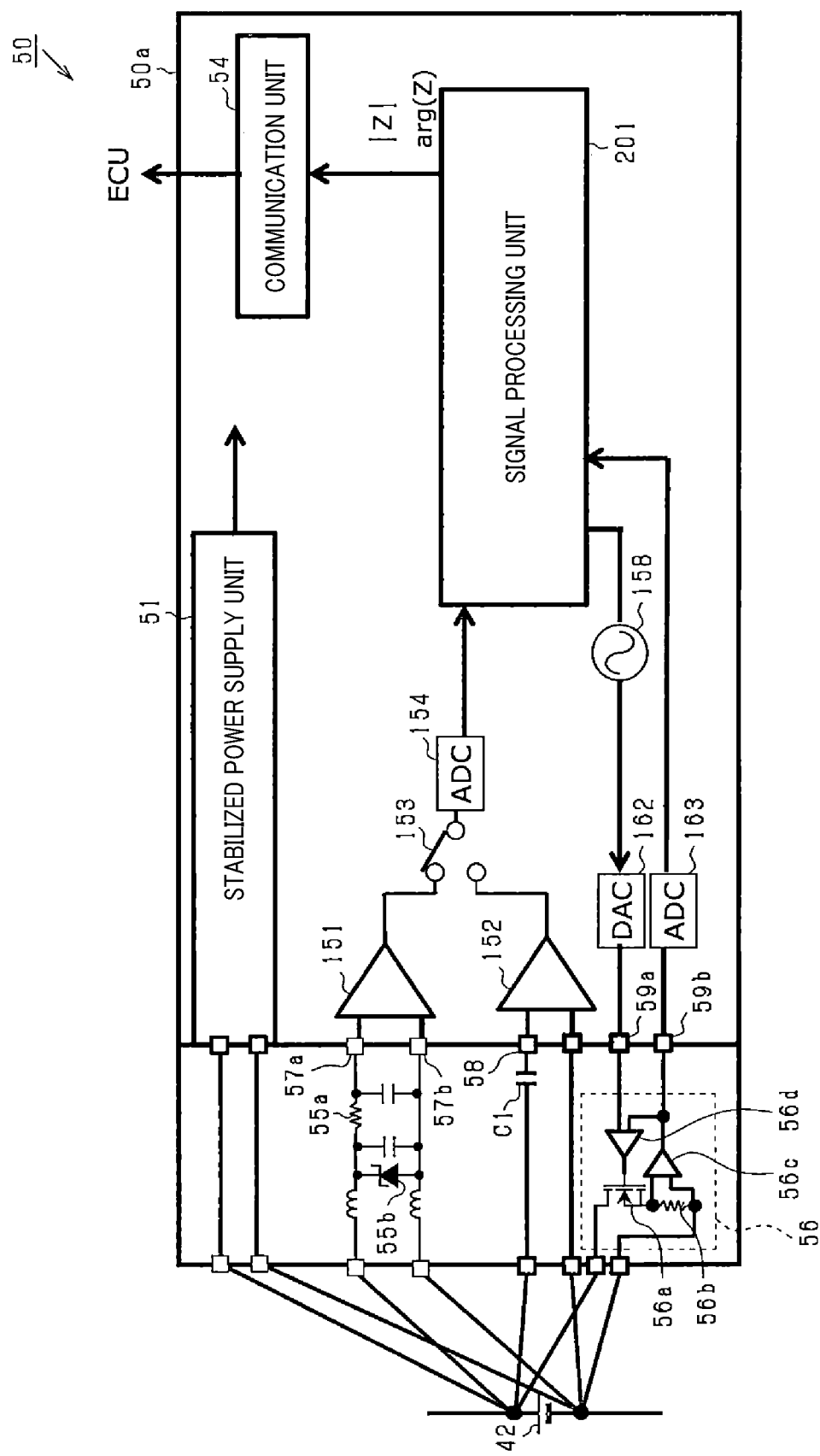
FIG. 12 is a configuration diagram of a battery monitoring apparatus according to a fifth embodiment.

FIG. 12 shows the configuration of a battery monitoring apparatus 50 according to the fifth embodiment, which is configured to perform a FFT (Fast Fourier Transform) in signal analyses.

As shown in FIG. 12, in the present embodiment, the ASIC 50a of the battery monitoring apparatus 50 includes a signal processing unit 201 that functions as a calculating unit to perform the FFT. The signal processing unit 201 is configured to receive the measurement value of the DC voltage of the battery cell 42 via the AD converter 154. Moreover, the signal processing unit 201 is also configured to receive the response signal via the AD converter 154. Furthermore, the signal processing unit 201 is also configured to receive the feedback signal via the AD converter 163. In addition, the signal processing unit 201 is connected with the oscillating circuit 158 and configured to be capable of setting the frequency of the sine-wave signal.

In the present embodiment, the signal processing unit 201 performs the FFT on each of the response signal (i.e., voltage signal) and the feedback signal (i.e., current signal). Then, the signal processing unit 201 calculates the real part, the imaginary part, the absolute value and the phase of the complex impedance of the battery cell 42 on the basis of the results of performing the FFT on the response signal and the feedback signal. Thereafter, the signal processing unit 201 outputs the calculation results to the ECU 60 via the communication unit 54.

Figure 13:
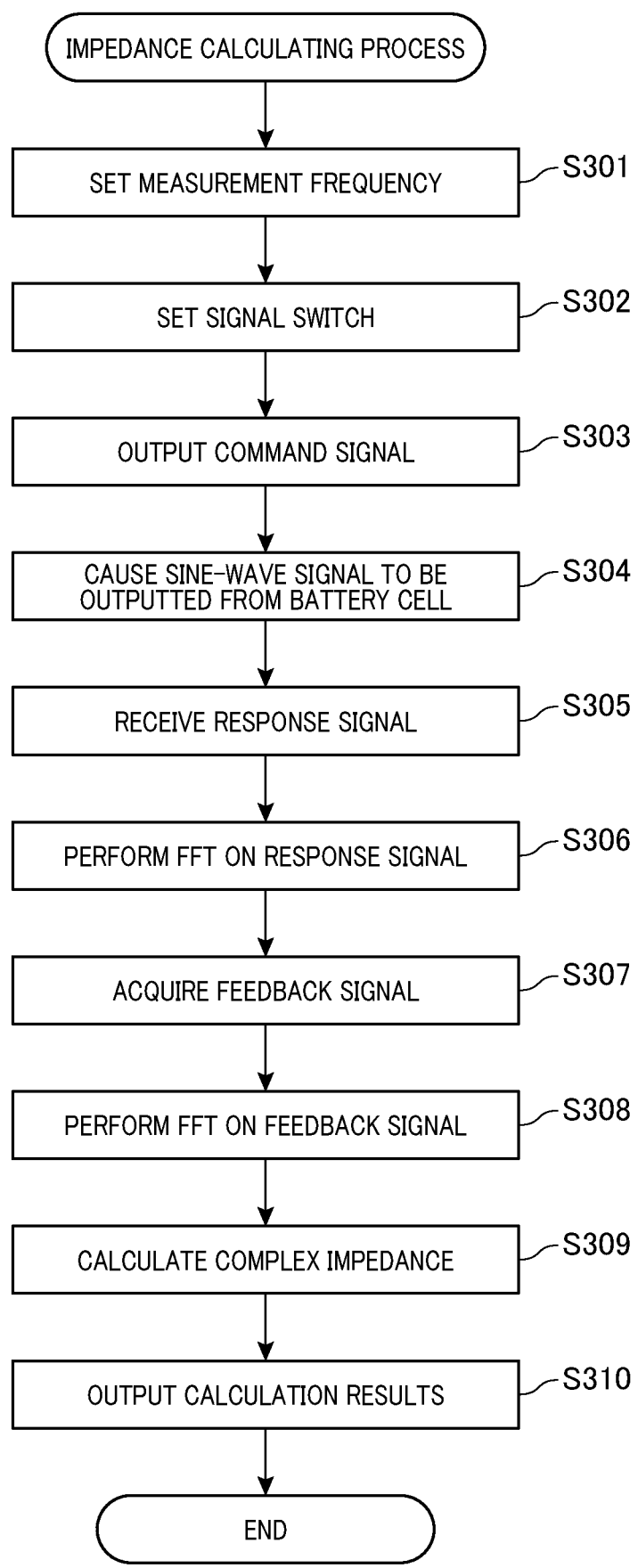
FIG. 13 is a flow chart illustrating a complex impedance calculating process according to the fifth embodiment.

Next, a process of calculating the complex impedance of a battery cell 42 according to the fifth embodiment will be described with reference to FIG. 13. This process is repeatedly performed by the battery monitoring apparatus 50 in a predetermined cycle.

Steps S301-S305 of the complex impedance calculating process according to the fifth embodiment are respectively identical to steps S201-S205 of the complex impedance calculating process according to the fourth embodiment. Therefore, descriptions of steps S301-S305 of the complex impedance calculating process according to the fifth embodiment are omitted hereinafter.

In addition, in the fifth embodiment, the measurement frequency and the offset value (i.e., DC bias) are set by the signal processing unit 201. Moreover, operation of the signal switch 153 and output of the command signal are commanded (or controlled) by the signal processing unit 201.

In step S306 of the complex impedance calculating process according to the fifth embodiment, the signal processing unit 201 performs the FFT on the response signal received from the AD converter 154. Consequently, information on the amplitude of the response signal with respect to the measurement frequency is obtained.

In step S307, the signal processing unit 201 acquires the feedback signal from the feedback signal input terminal 59b. More specifically, the feedback signal is inputted from the feedback signal input terminal 59b to the signal processing unit 201 through the analog-to-digital conversion by the AD converter 163.

In step S308, the signal processing unit 201 performs the FFT on the feedback signal. Consequently, information on the amplitude of the feedback signal with respect to the measurement frequency is obtained.

In step S309, the signal processing unit 201 calculates, based on both the amplitude information of the response signal obtained in step S306 and the amplitude information of the feedback signal obtained in step S308, at least one of the real part, the imaginary part, the absolute value and the phase of the complex impedance of the battery cell 42.

In step S310, the signal processing unit 201 outputs the calculation results to the ECU 60 via the communication unit 54. Then, the complex impedance calculating process terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

According to the fifth embodiment, it is possible to achieve the following advantageous effects.

In the battery monitoring apparatus 50 according to the present embodiment, the signal processing unit 201 performs the FFT on each of the response signal and the feedback signal, thereby obtaining not only the amplitude information and phase information of both the response and feedback signals (i.e., voltage and current signals) with respect to the measurement frequency but also the amplitude information and phase information of both the response and feedback signals with respect to harmonics of the measurement frequency. Consequently, it becomes possible to calculate the complex impedance of the battery cell 42 with respect to a plurality of frequencies at one time.

Moreover, in the present embodiment, the signal processing unit 201 acquires, from the current modulation circuit 56, the feedback signal that is the detected current signal actually outputted from (or actually flowing out of) the battery cell 42. Then, the signal processing unit 201 performs the FFT on the feedback signal. Consequently, it becomes possible to correct (or eliminate) any deviation in amplitude or phase between the current signal actually outputted from the battery cell 42 and the sine-wave signal commanded by the command signal. As a result, it becomes possible to improve the accuracy of calculation of the complex impedance of the battery cell 42.

Sixth Embodiment

A battery monitoring apparatus 50 according to the sixth embodiment has the same basic configuration as the battery monitoring apparatus 50 according to the fourth embodiment. That is, the battery monitoring apparatus 50 according to the sixth embodiment is also configured to perform two-phase lock-in detection on the response signal. Therefore, only the differences of the battery monitoring apparatus 50 according to the sixth embodiment from the battery monitoring apparatus 50 according to the fourth embodiment will be described hereinafter.

According to the fourth embodiment, noise signals, such as white noise signals, can be reduced by performing two-phase lock-in detection on the response signal. However, when there is present a noise signal having the same constant frequency as the predetermined AC signal and the phase of the noise signal is coincident with the phase of the predetermined AC signal, the noise signal may be detected along with the response signal by the two-phase lock-in detection, resulting in an error in the detection of the response signal. In addition, noise signals having a constant frequency may include, for example, a noise signal caused by a noise source (e.g., an inverter) present in a vehicle and a noise signal caused by a noise source (e.g., a charger) temporally connected to the vehicle.

Figure 14:
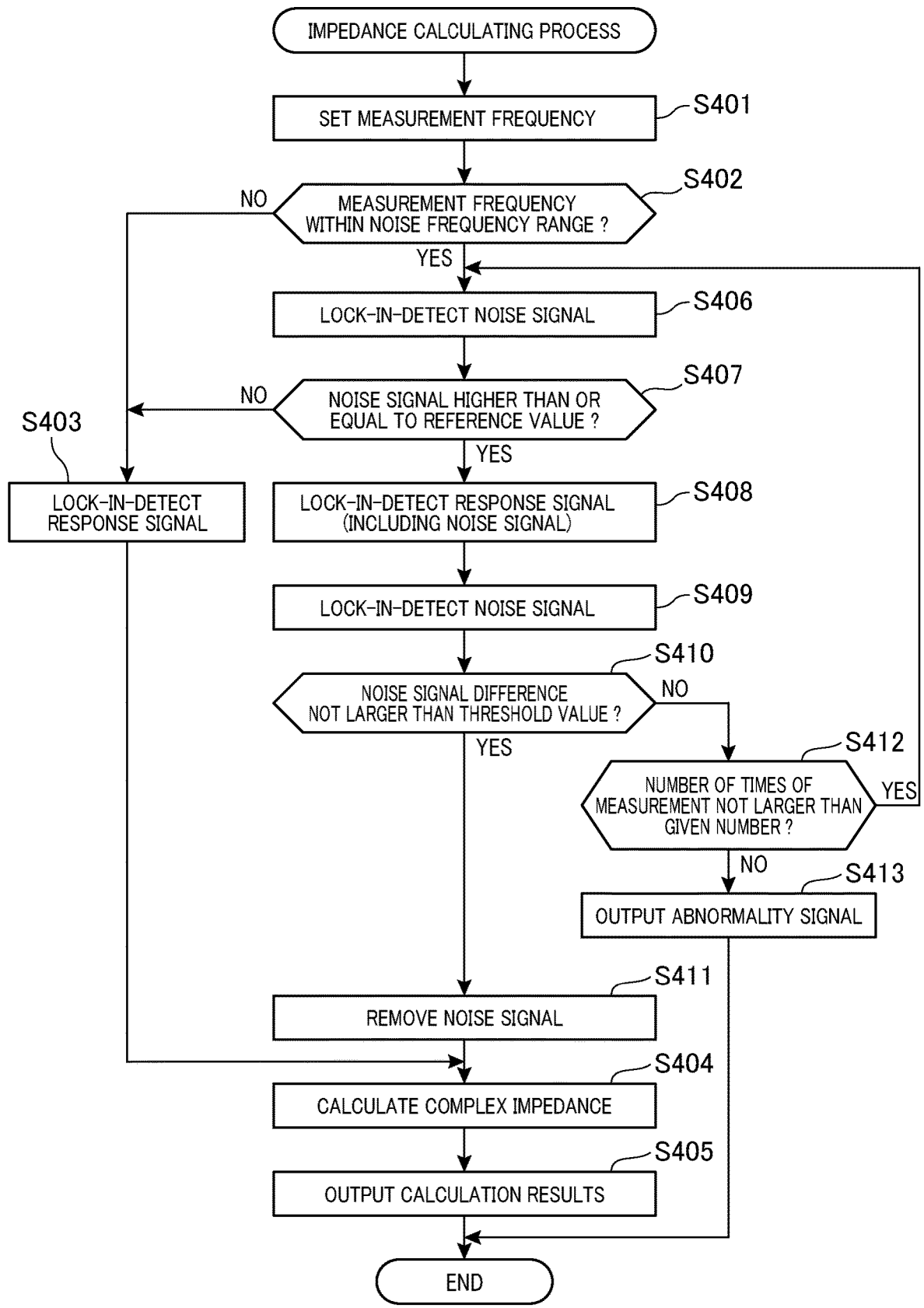
FIG. 14 is a flow chart illustrating a complex impedance calculating process according to a sixth embodiment.

To solve the above problem, the battery monitoring apparatus 50 according to the sixth embodiment is configured to perform a complex impedance calculating process as shown in FIG. 14. This process is repeatedly performed by the battery monitoring apparatus 50 in a predetermined cycle.

In the complex impedance calculating process, first, in step S401, the signal processing unit 155 sets a measurement frequency of the complex impedance within a predetermined frequency range.

In step S402, the signal processing unit 155 determines whether the measurement frequency is within a predetermined noise frequency range.

Here, the noise frequency range is predetermined as a frequency range in which noise signals having a constant frequency are highly likely to be generated. For example, a noise signal caused by an inverter may have a frequency equal or close to the drive frequency of the inverter and harmonic components of the drive frequency, or a resonance frequency due to inductance and capacitance components including the parasitic inductance and parasitic capacitance of the inverter and harmonic components of the resonance frequency. Therefore, it is possible to predetermine, based on the drive frequencies of noise sources such as an inverter and the results of experiments, the noise frequency range in which noise signals having a constant frequency are highly likely to be generated. The predetermined noise frequency range is stored in a memory (not shown) of the signal processing unit 155.

If the determination in step S402 results in a "NO" answer, then the process proceeds to step S403.

In step S403, the signal processing unit 155 lock-in-detects the response signal. Then, the process proceeds to step S404. In addition, the lock-in detection may be performed on the response signal in the same manner as described in the fourth embodiment (see steps S202-S207 of FIG. 11).

In step S404, the signal processing unit 155 calculates, based on the inputted frequency component of the response signal and the current signal outputted from the battery cell 42, at least one of the real part, the imaginary part, the absolute value and the phase of the complex impedance of the battery cell 42. In addition, the current signal outputted from the battery cell 42 may be determined based on the feedback signal or the sine-wave signal commanded by the command signal. Alternatively, the current signal may be determined by lock-in-detecting the measurement frequency component from the feedback signal.

In step S405, the signal processing unit 155 outputs the calculation results to the ECU 60 via the communication unit 54. Then, the complex impedance calculating process terminates.

On the other hand, if the determination in step S402 results in a "YES" answer, the process proceeds to step S406.

In step S406, the signal processing unit 155 lock-in-detects a noise signal (or background noise).

Specifically, in step S406, the signal processing unit 155 lock-in-detects a noise signal that is detectable when no disturbance is applied to the battery cell 42. That is, in a state where no sine-wave signal is caused by the current modulation circuit 56 to be outputted from the battery cell 42, the signal processing unit 155 performs the lock-in detection to extract the frequency component (DC component) of the noise signal at the frequency of the sine-wave signal (or the measurement signal). In addition, the lock-in detection performed on the noise signal is identical to the lock-in detection performed on the response signal except that no sine-wave signal is outputted from the battery cell 42 during the lock-in detection performed on the noise signal. Therefore, description of the lock-in detection performed on the noise signal is omitted hereinafter.

After step S406, the process proceeds to step S407 upon input of the frequency component of the noise signal to the signal processing unit 155.

In step S407, the signal processing unit 155 determines whether the inputted frequency component of the noise signal is higher than or equal to a predetermined reference value. By this determination, the signal processing unit 155 determines the presence or absence of a high-level noise signal. That is, in the present embodiment, the signal processing unit 155 also functions as a noise determining unit.

If the determination in step S407 results in a "NO" answer, in other words, if the level of the noise signal is not high, then the process proceeds to step S403.

In contrast, if the determination in step S407 results in a "YES" answer, then the process proceeds to step S408.

In step S408, the signal processing unit 155 lock-in-detects the frequency component of the response signal (including the noise signal) at the measurement frequency. In addition, the frequency component of the response signal obtained in step S408 includes an error due to the noise signal.

After step S408, the process proceeds to step S409 upon input of the frequency component of the response signal to the signal processing unit 155.

In step S409, the signal processing unit 155 again lock-in-detects the noise signal in the same manner as in step S406.

In addition, in steps S406-S409, it is necessary to adjust the phase of the reference signal to be the same in these steps. This is because the lock-in detection cannot be performed normally with an offset (or shift) of the phase of the reference signal. As a method of preventing an offset of the phase of the reference signal, for example, upon start of the output of the reference signal in step S406, the output of the reference signal may be continued during execution of the subsequent steps, thereby maintaining a constant relationship of phase between the response signal and the noise signal.

After step S409, the process proceeds to step S410 upon input of the frequency component of the noise signal to the signal processing unit 155.

In step S410, the signal processing unit 155 compares the frequency component of the noise signal inputted thereto immediately after step S406 and the frequency component of the noise signal inputted thereto immediately after step S409. Then, the signal processing unit 155 determines whether the difference (i.e., amplitude difference) between the frequency components of the noise signal obtained respectively in steps S406 and S409 is not larger than (i.e., smaller than or equal to) a threshold value. That is, the signal processing unit 155 determines whether there is a considerable change in the noise signal before and after the acquisition of the frequency component of the response signal.

If the determination in step S410 results in a "YES" answer, the process proceeds to step S411.

In step S411, the signal processing unit 155 removes the noise signal from the frequency component of the response signal obtained in step S408.

More specifically, in this step, the signal processing unit 155 removes the noise signal by subtracting the frequency component of the noise signal obtained in step S406 (or in step S409) from the frequency component of the response signal obtained in step S408. That is, in the present embodiment, the signal processing unit 155 also functions as a noise removing unit.

After step S411, the process proceeds to step S404, in which the signal processing unit 155 calculates, based on the frequency component of the response signal calculated in step S411 and the current signal outputted from the battery cell 42, at least one of the real part, the imaginary part, the absolute value and the phase of the complex impedance of the battery cell 42.

On the other hand, if the determination in step S410 results in a "NO" answer, then the process proceeds to step S412.

In step S412, the signal processing unit 155 determines whether the number of times of measurement of the response signal is not larger than (i.e., smaller than or equal to) a given number.

If the determination in step S412 results in a "YES" answer, then the signal processing unit 155 increases the number of times of measurement of the response signal by one. Thereafter, the process returns to step S406 to repeat step S406 and the subsequent steps. In addition, the number of times of measurement of the response signal is reset at the start or at the end of the process.

On the other hand, if the determination in step S412 results in a "NO" answer, then the process proceeds to step S413.

In step S413, the signal processing unit 155 outputs an abnormality signal to the ECU 60 via the communication unit 54, thereby notifying the ECU 60 that the response signal cannot be accurately inputted to the signal processing unit 155. Then, the process directly terminates.

The above calculating process is repeated until the complex impedance of the battery cell 42 has been calculated with respect to a plurality of measurement frequencies within the predetermined frequency range. Based on the calculation results, the ECU 60 creates, for example, a complex impedance plane plot (or Cole-Cole plot) and thereby determines the characteristics of the electrodes and the electrolyte of the battery cell 42. For example, the ECU 60 determines the SOC and/or SOH of the battery cell 42.

In addition, it is not necessarily needed to create the entire Cole-Cole plot. Instead, it is possible to focus on only part of the Cole-Cole plot. For example, it is possible to: (1) measure the complex impedance of the battery cell 42 at a specific frequency at predetermined time intervals during traveling of the vehicle; and (2) determine changes in the SOC, SOH and temperature of the battery cell 42 during the traveling based on the change with time of the complex impedance at the specific frequency. Alternatively, it is also possible to: (1) measure the complex impedance of the battery cell 42 at a specific frequency at predetermined time intervals (e.g., once every day, every week or every year); and (2) determine the change with time of the SOH of the battery cell 42 based on the change with time of the complex impedance at the specific frequency.

According to the sixth embodiment, it is possible to achieve the following advantageous effects.

In the battery monitoring apparatus 50 according to the present embodiment, the signal processing unit 155 determines, before causing the sine-wave signal (or predetermined AC signal) to be outputted from the battery cell 42, the presence or absence of a noise signal having a frequency component corresponding to the frequency of the sine-wave signal (or the measurement frequency). If such a noise signal is present, then the signal processing unit 155 removes the noise signal from the frequency component of the response signal.

Specifically, the signal processing unit 155 removes the noise signal by subtracting the frequency component of the noise signal from the frequency component of the response signal. Thereafter, the signal processing unit 155 calculates the complex impedance of the battery cell 42 based on the frequency component of the response signal from which the noise signal has been removed and the current signal outputted from the battery cell 42. Consequently, when there is present a noise signal having the same frequency as the measurement frequency, it will be possible to suppress the influence of the noise signal on the detection of the response signal, thereby improving the accuracy of calculation of the complex impedance of the battery cell 42.

Moreover, in the battery monitoring apparatus 50 according to the present embodiment, the signal processing unit 155 acquires, before causing the sine-wave signal to be outputted from the battery cell 42, the noise signal flowing to the battery cell 42. Then, the signal processing unit 155 detects the frequency component of the noise signal corresponding to the sine-wave signal based on the value obtained by multiplying the noise signal and the reference signal together; the reference signal is determined according to the sine-wave signal commanded by the command signal.

Consequently, by lock-in-detecting the frequency component of the noise signal corresponding to the measurement frequency, it becomes possible to accurately perform removal of the noise signal. Moreover, since the noise signal is identified utilizing the existing configuration for lock-in-detecting the response signal, it becomes possible to suppress increase in the size and cost of the battery monitoring apparatus 10.

In the vehicular electric power supply system described in the first embodiment, the inverter 30 drives the motor 20 at a predetermined drive frequency. Therefore, a noise signal is likely to be generated within a specific frequency band based on the drive frequency. In view of the above, in the present embodiment, when the measurement frequency set in step S401 is within the predetermined noise frequency range, the signal processing unit 155 determines that a noise signal corresponding to the measurement frequency is highly likely to be present. Consequently, it becomes possible to easily and simply determine whether a noise signal corresponding to the measurement frequency is highly likely to be present.

Furthermore, in the battery monitoring apparatus 50 according to the present embodiment, upon determining that a noise signal corresponding to the measurement frequency is highly likely to be present, the signal processing unit 155 further determines the presence or absence of the noise signal by determining whether the frequency component of the lock-in-detected noise signal is higher than or equal to the reference value. Consequently, it becomes possible to accurately determine the presence or absence of a noise signal corresponding to the measurement frequency.

Seventh Embodiment

A battery monitoring apparatus 50 according to the seventh embodiment is configured to perform a complex impedance calculating process different from the complex impedance calculating process described in the sixth embodiment.

Specifically, compared to the complex impedance calculating process described in the sixth embodiment (see FIG. 14), step S402 is omitted from the complex impedance calculating process according to present embodiment.

That is, in the complex impedance calculating process according to present embodiment, regardless of whether the measurement frequency is within the predetermined noise frequency range, the signal processing unit 155 lock-in-detects the frequency component of a noise signal corresponding to the measurement frequency and determines the presence or absence of the noise signal based on the amplitude of the detected frequency component.

Eighth Embodiment

A battery monitoring apparatus 50 according to the eighth embodiment is configured to perform a complex impedance calculating process different from the complex impedance calculating process described in the sixth embodiment.

Specifically, in the complex impedance calculating process according to the present embodiment, the signal processing unit 155 does not determine the presence or absence of a noise signal. That is, compared to the complex impedance calculating process described in the sixth embodiment (see FIG. 14), steps S402, S403 and S407 are omitted from the complex impedance calculating process according to present embodiment.

Accordingly, in the complex impedance calculating process according to the present embodiment, the signal processing unit 155 lock-in-detects, each time the process is performed, the frequency component of a noise signal corresponding to the measurement frequency and removes the detected frequency component from the frequency component of the response signal.

Ninth Embodiment

A battery monitoring apparatus 50 according to the ninth embodiment is configured to perform a complex impedance calculating process different from the complex impedance calculating process described in the sixth embodiment.

Specifically, compared to the complex impedance calculating process described in the sixth embodiment (see FIG. 14), no noise removal is performed in the complex impedance calculating process according to the present embodiment.

Instead, in the complex impedance calculating process according to the present embodiment, if the determination in step S402 results in a "YES" answer, i.e., if the measurement frequency is within the predetermined noise frequency range in which noise signals having a constant frequency are highly likely to be generated, the signal processing unit 155 changes, by any suitable method, the measurement frequency so as to be outside the predetermined noise frequency range. Then, the process proceeds to step S403. Consequently, it becomes possible to avoid, by a simple method, noise signals having a constant frequency.

Tenth Embodiment

A battery monitoring apparatus 50 according to the tenth embodiment is configured to perform a complex impedance calculating process different from the complex impedance calculating process described in the sixth embodiment.

Specifically, compared to the complex impedance calculating process described in the sixth embodiment (see FIG. 14), no noise removal is performed in the complex impedance calculating process according to the present embodiment.

Instead, in the complex impedance calculating process according to the present embodiment, the signal processing unit 155 lock-in-detects the frequency component of a noise signal corresponding to the measurement frequency, and determines whether the detected frequency component is higher than or equal to the predetermined reference value. If the determination results in a "YES" answer, then the signal processing unit 155 changes the measurement frequency. Consequently, it becomes possible to avoid, by a simple method, noise signals having a constant frequency.

While the above particular embodiments have been shown and described, it will be understood by those skilled in the art that various modifications, changes and improvements may be made without departing from the spirit of the present disclosure.

(1) As described above, in the first embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 15:
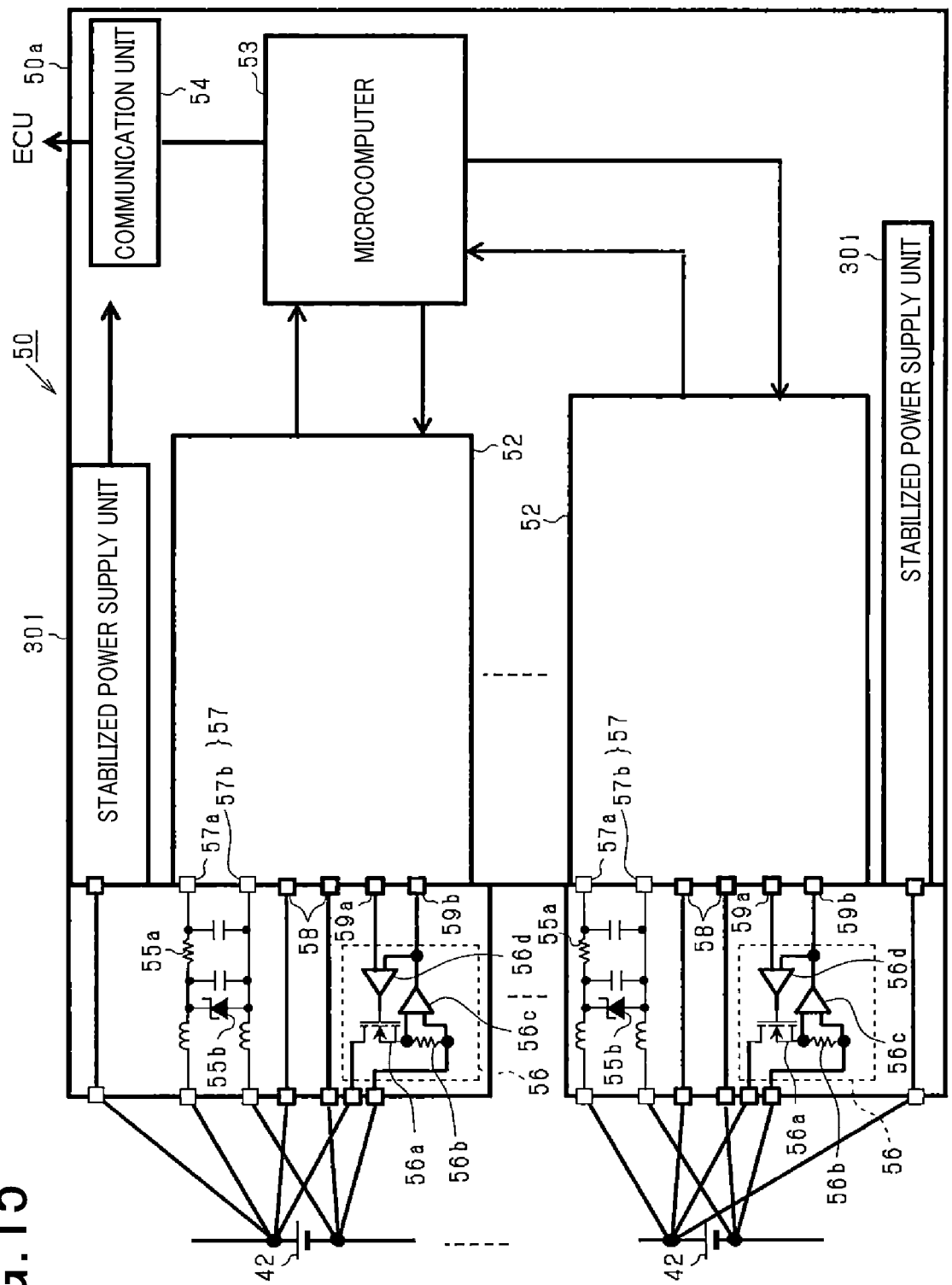
FIG. 15 is a configuration diagram of a battery monitoring apparatus according to a modification.

For example, as shown in FIG. 15, the stabilized power supply unit 301, the communication unit 54 and the microcomputer 53 of the battery monitoring apparatus 50 are shared by all the battery cells 42 of the battery pack 40 (or of one battery module 41). In this case, the electric potentials of the negative electrodes of the battery cells 42 may be different from each other. Accordingly, the reference electric potentials of the battery cells 42 for various electrical signals used to communicate various types of information may also be different from each other. Therefore, it is necessary to have the various electrical signals from the battery cells 42 inputted to the microcomputer 53 and processed by the microcomputer 53 taking into account the differences between the reference electric potentials. In addition, as means for communicating signals between different reference electric potentials, a capacitor, a transformer, a radio wave and/or light may be employed.

(2) As described above, in the fourth embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 16:
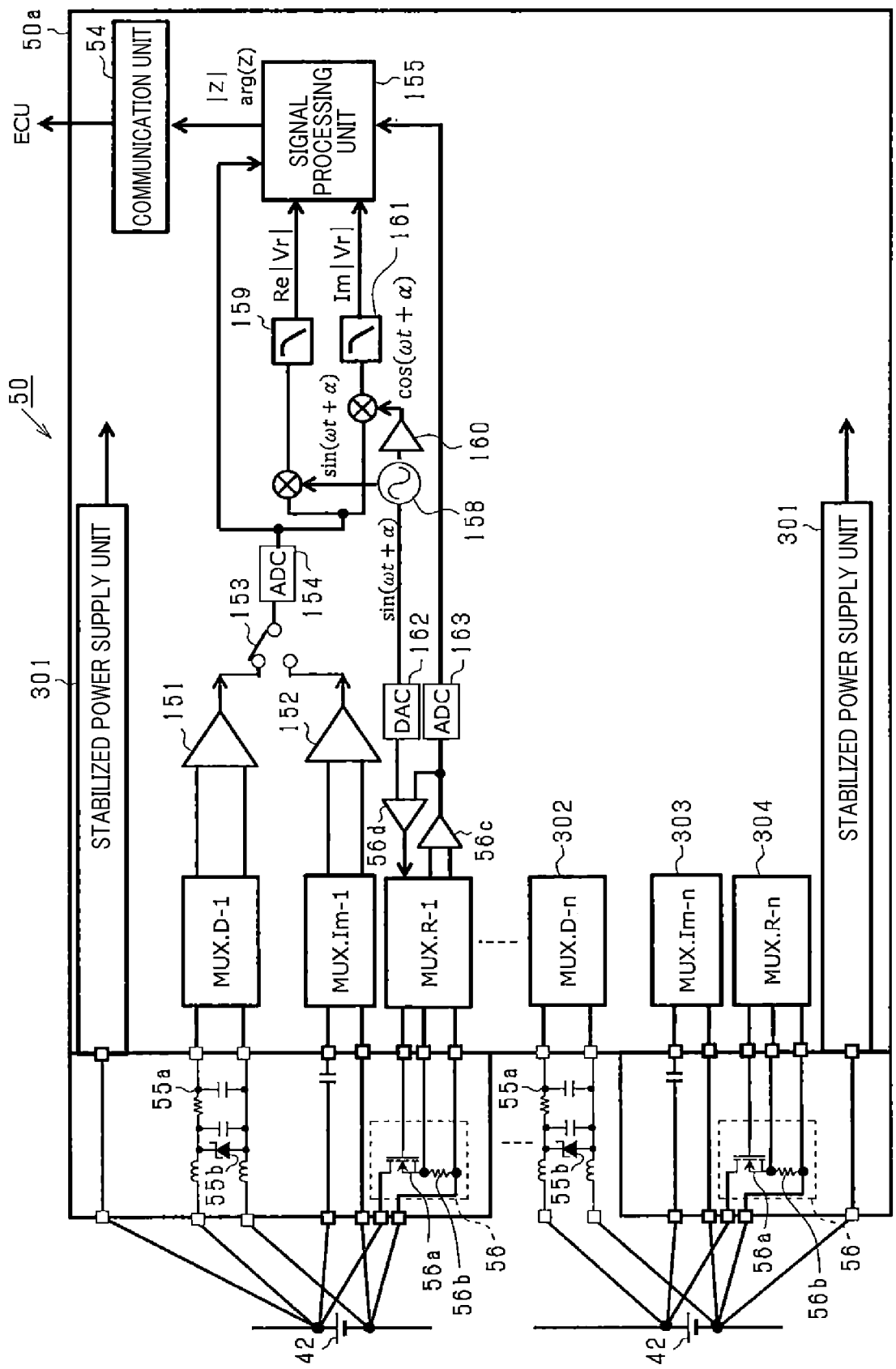
FIG. 16 is a configuration diagram of a battery monitoring apparatus according to another modification.

For example, as shown in FIG. 16, the stabilized power supply unit 301, the communication unit 54, the differential amplifier 151, the preamplifier 152, the signal switch 153, the AD converters 154 and 163, the signal processing unit 155, the first multiplier 156, the second multiplier 157, the low-pass filters 159 and 161, the oscillating circuit 158, the phase-shift circuit 160, the DA converter 162, the feedback circuit 56d and the current detection amplifier 56c may be shared by all the battery cells 42 of the battery pack 40 (or of one battery module 41).

Moreover, in this case, multiplexers 302-304 may be employed to perform switching of various signals, such as the DC voltage, the response signal and the command signal, between the battery cells 42. In addition, the multiplexers 302-304 may be controlled by, for example, the signal processing unit 155.

(3) As described above, in the fifth embodiment, each battery monitoring apparatus 50 is configured to monitor one battery cell 42. Alternatively, each battery monitoring apparatus 50 may be configured to monitor a plurality of battery cells 42 (e.g., all the battery cells 42 of one battery module 41 or all the battery cells 42 of the entire battery pack 40). Moreover, some functions of the battery monitoring apparatus 50 may be shared by all the battery cells 42.

Figure 17:
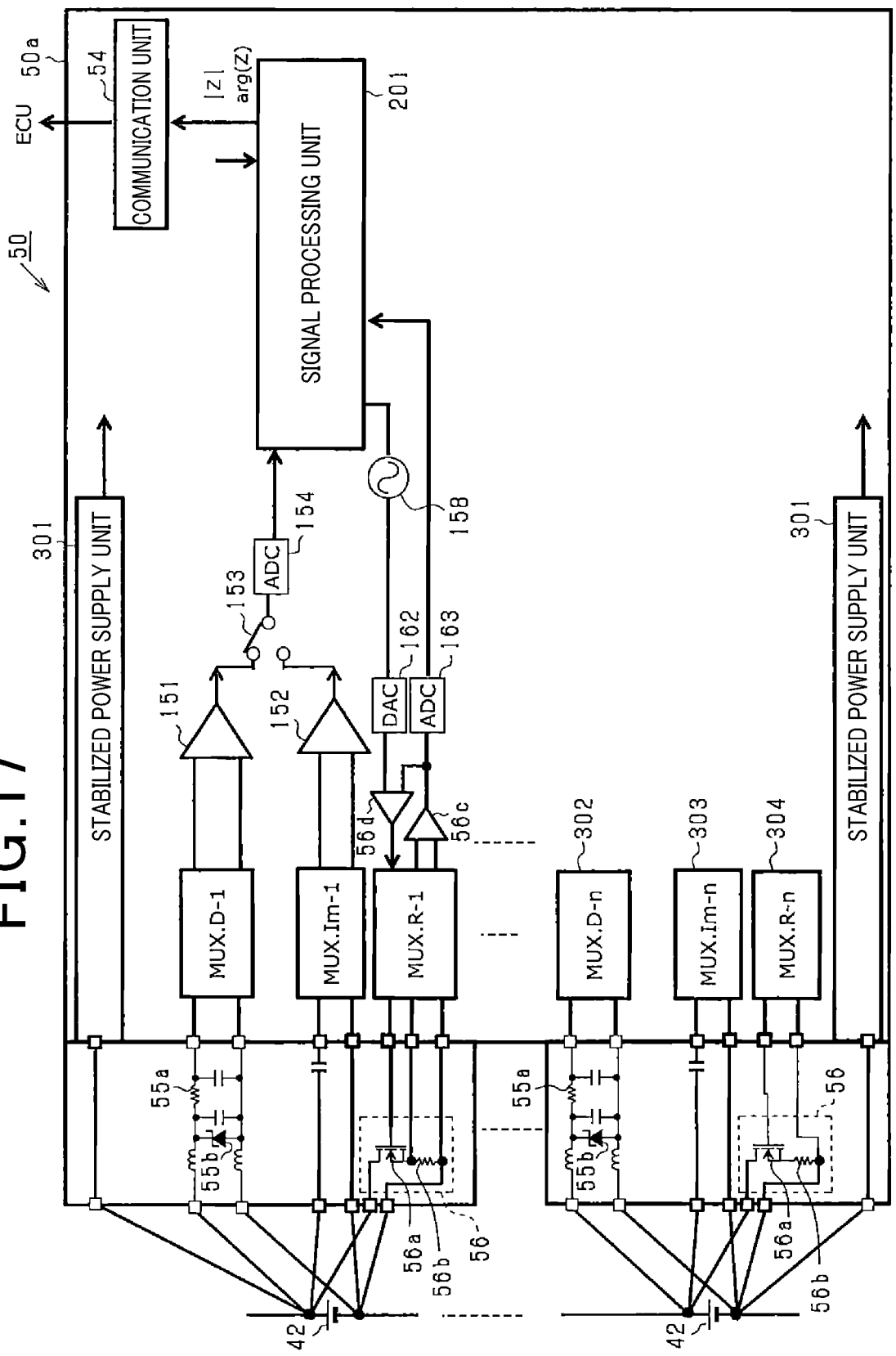
FIG. 17 is a configuration diagram of a battery monitoring apparatus according to yet another modification.

For example, as shown in FIG. 17, the stabilized power supply unit 301, the communication unit 54, the differential amplifier 151, the preamplifier 152, the signal switch 153, the AD converters 154 and 163, the signal processing unit 201, the oscillating circuit 158, the DA converter 162, the feedback circuit 56d and the current detection amplifier 56c may be shared by all the battery cells 42 of the battery pack 40 (or of one battery module 41).

Moreover, in this case, multiplexers 302-304 may be employed to perform switching of various signals, such as the DC voltage, the response signal and the command signal, between the battery cells 42. In addition, the multiplexers 302-304 may be controlled by, for example, the signal processing unit 201.

(4) In the above-described embodiments (see FIGS. 2, 10 and 12) and modifications (see FIGS. 15-17), the battery monitoring apparatus 50 may be powered by both a first electric power supply and a plurality of second electric power supplies. The first electric power supply is configured with a plurality of the battery cells 42 connected in series with each other. Moreover, the first electric power supply has a positive-electrode-side electric power supply terminal connected with that one of the positive electrodes of the plurality of battery cells 42 which has a highest electric potential and a negative-electrode-side electric power supply terminal connected with that one of the negative electrodes of the plurality of battery cells 42 which has a lowest electric potential. In contrast, each of the second electric power supplies is configured with a corresponding one of the battery cells 42. Moreover, each of the second electric power supplies has a pair of positive-electrode-side and negative-electrode-side electric power supply terminals connected respectively with the positive and negative electrodes of the corresponding battery cell 42.

Figure 18:
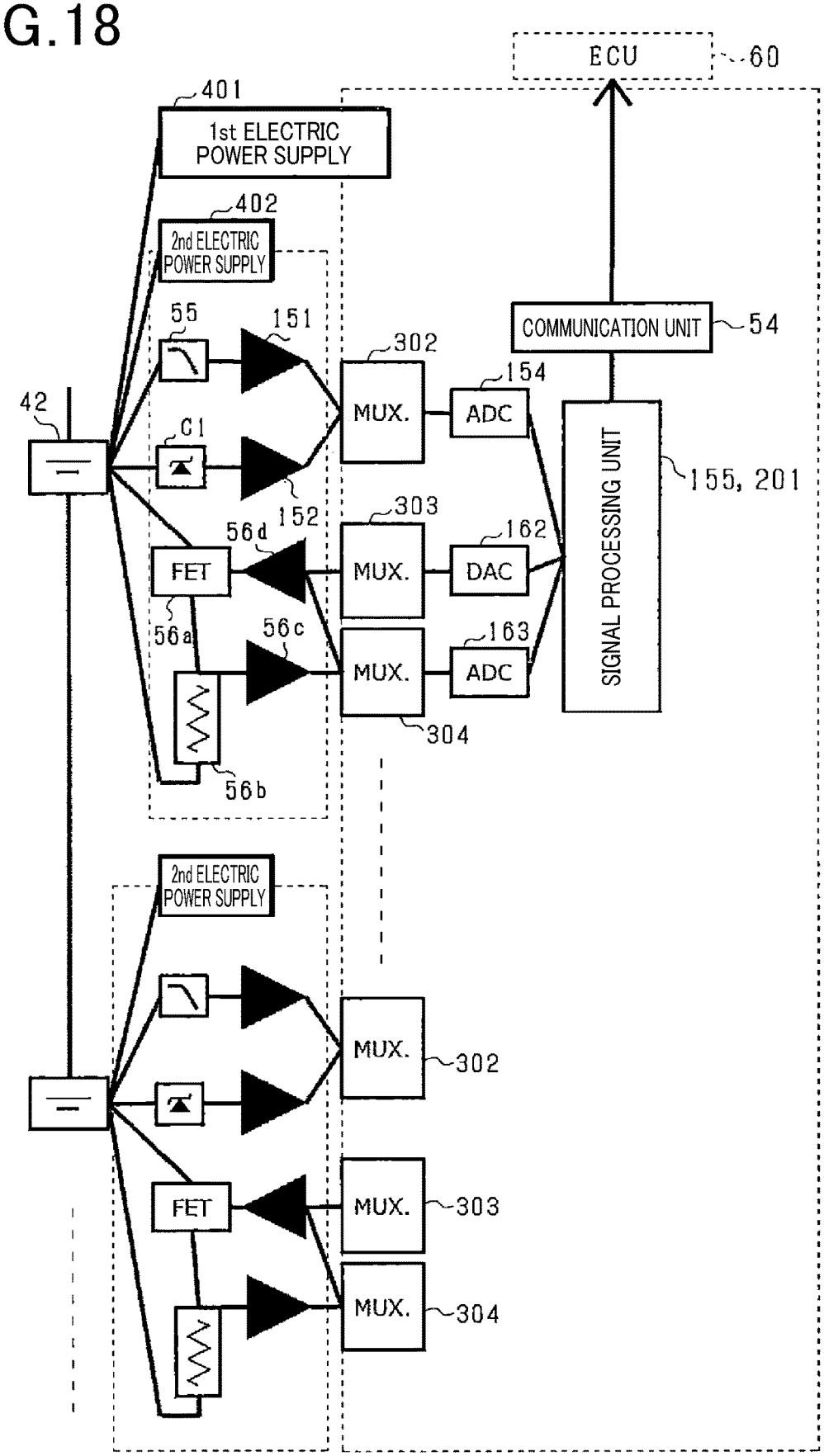
FIG. 18 is a configuration diagram of a battery monitoring apparatus according to still another modification.

For example, in a modification shown in FIG. 18, the communication unit 54, the AD converters 154 and 163, the signal processing unit 155 or 201, the oscillating circuit 158, the phase-shift circuit 160 and the DA converter 162 are shared by all the battery cells 42. In addition, though the first multiplier 156, the second multiplier 157 and the low-pass filters 159 and 161 are not shown in FIG. 18, they may also be shared by all the battery cells 42 in the case of the signal processing unit 155 being employed to perform the two-phase lock-in detection.

Moreover, in the modification shown in FIG. 18, those components of the battery monitoring apparatus 50 which are shared by all the battery cells 42 are powered by a first electric power supply 401 that is configured with a plurality of battery cells 42 connected in series with each other. In contrast, each component set corresponding to only one of the battery cells 42 is powered by a second electric power supply 402 that is configured with the corresponding battery cell 42. In addition, the output voltage of the first electric power supply 401 is higher than the output voltage of each of the second electric power supplies 402.

Furthermore, in the modification shown in FIG. 18, multiplexers 302-304 are employed to perform switching of various signals, such as the DC voltage, the response signal and the command signal, between the battery cells 42.

(5) In the above-described embodiments (see FIGS. 2, 10 and 12) and modifications (see FIGS. 15-17), the battery monitoring apparatus 50 may be modified to further perform an equalization process for equalizing the states of charge and/or voltages of the battery cells 42. Specifically, the equalization process is a process for causing the battery cell(s) 42 having a higher SOC (i.e., state of charge) than the other battery cell(s) 42 to discharge and thereby equalizing the states of charge of all the battery cells 42. Consequently, it is possible to prevent the occurrence of a phenomenon where some of the battery cells 42 become overcharged.

Moreover, in the case of the battery monitoring apparatus 50 being modified to further perform the equalization process, each of the battery cells 42 may be caused by the corresponding current modulation circuit 56 to discharge. In this case, the battery monitoring apparatus 50 also functions as a discharge control unit.

For example, in the first embodiment (see FIG. 2), the equalization process may be performed by the microcomputer 53 as follows. Upon receipt of a discharge command that is issued by the ECU 60 based on the SOC of the battery cell 42 or upon the SOC or voltage of the battery cell 42 exceeding a predetermine threshold, the microcomputer 53 sends the command signal to the current modulation circuit 56. Then, upon receipt of the command signal, the current modulation circuit 56 causes a periodic-function signal (e.g., a sine-wave or rectangular-wave signal) or a DC signal to be outputted from the battery cell 42. Moreover, the microcomputer 53 continues sending the command signal to the current modulation circuit 56 until the discharge command has been terminated or the SOC or voltage of the battery cell 42 has been lowered below the predetermined threshold.

In addition, in the fourth and fifth embodiments (see FIGS. 10 and 12) and the modifications (see FIGS. 15-17), the equalization process may be similarly performed by the microcomputer 53 or by the signal processing unit 155 or 201.

Furthermore, the complex impedance of the battery cell 42 may be calculated based on the response signal of the battery cell 42 to the sine-wave signal that is outputted for performing the equalization process. In this case, it is possible to suppress the consumption of electric power of the battery cell 42.

In addition, the strength of the sine-wave signal outputted for performing the equalization process is generally set to be low (or weak) for suppressing the electric power consumption and minimizing the size of the apparatus. Therefore, the battery monitoring apparatuses 50 according to the fourth and sixth embodiments, which are configured to perform the two-phase lock-in detection, are particularly suitable for performing the equalization process.

(6) In the above-described embodiments, the filter unit 55 is implemented by the semiconductor elements. Alternatively, the filter unit 55 may be implemented by, instead of or in combination with the semiconductor elements, wirings, connector contacts, and pattern wirings and/or solid patterns formed on a printed board.

(7) In the above-described embodiments, a filter circuit may be provided between the current modulation circuit 56 and the input/output unit 52 (or the DA converter 162). In this case, it is possible to suppress, with the filter circuit, occurrence of an error in the waveform of the command signal during the digital-to-analog conversion of the command signal.

(8) In the above-described embodiments, some or all of the differential amplifier 151, the preamplifier 152, the signal switch 153, the AD converters 154 and 163, the signal processing unit 155, the first multiplier 156, the second multiplier 157, the low-pass filters 159 and 161, the oscillating circuit 158, the phase-shift circuit 160, the DA converter 162, the feedback circuit 56d and the current detection amplifier 56c may be realized by software.

(9) In the above-described embodiments, the feedback circuit 56d may be omitted from the battery monitoring apparatus 50. Moreover, the current signal flowing through the resistor 56b may not be detected by the current detection amplifier 56c. Furthermore, the microcomputer 53 and the signal processing unit 155 or 201 may have no feedback signal inputted thereinto.

(10) In the above-described embodiments, the DC voltage of the battery cell 42 that is the monitoring target is detected by the battery monitoring apparatus 50. However, the DC voltage of the battery cell 42 may not be detected by the battery monitoring apparatus 50.

(11) In the above-described fourth to tenth embodiments, the signal switch 153 may be omitted from the battery monitoring apparatus 50. In this case, the measured DC voltage may be directly inputted to the signal processing unit 155 or 201.

(12) In the above-described fourth to tenth embodiments, the feedback signal may also be selected by the signal switch 153. In other words, the signal switch 153 may alternatively be configured to select between the DC voltage, the response signal and the feedback signal. In this case, it is possible to omit the AD converter 163 and perform all the analog-to-digital conversions of the DC voltage, the response signal and the feedback signal using the single AD converter 154.

(13) The battery monitoring apparatuses 50 according to the above-described embodiments may be applied to a HEV (Hybrid Electric Vehicle), an EV (Electric Vehicle), a PHV (Plug-in Hybrid Vehicle), an automotive accessory battery, an electric aircraft, an electric motorcycle and an electric ship.

(14) In the above-described fourth to tenth embodiments, to prevent occurrence of aliasing during the analog-to-digital conversion by the AD converter 154, a filter circuit may be provided immediately before or after the preamplifier 152, or immediately before the AD converter 154.

(15) In the above-described embodiments, each battery monitoring apparatus 50 may be configured to monitor a state of one battery module 41. In this case, the communications from the communication units 54 of the battery monitoring apparatuses 50, which respectively monitor the battery modules 41, to the ECU 60 may be isolated-communications having different electric potential references. The isolated-communications may be realized using, for example, an isolation transformer or capacitor.

(16) In the above-described fourth and sixth to tenth embodiments, the feedback signal may also be lock-in-detected.

Figure 19:
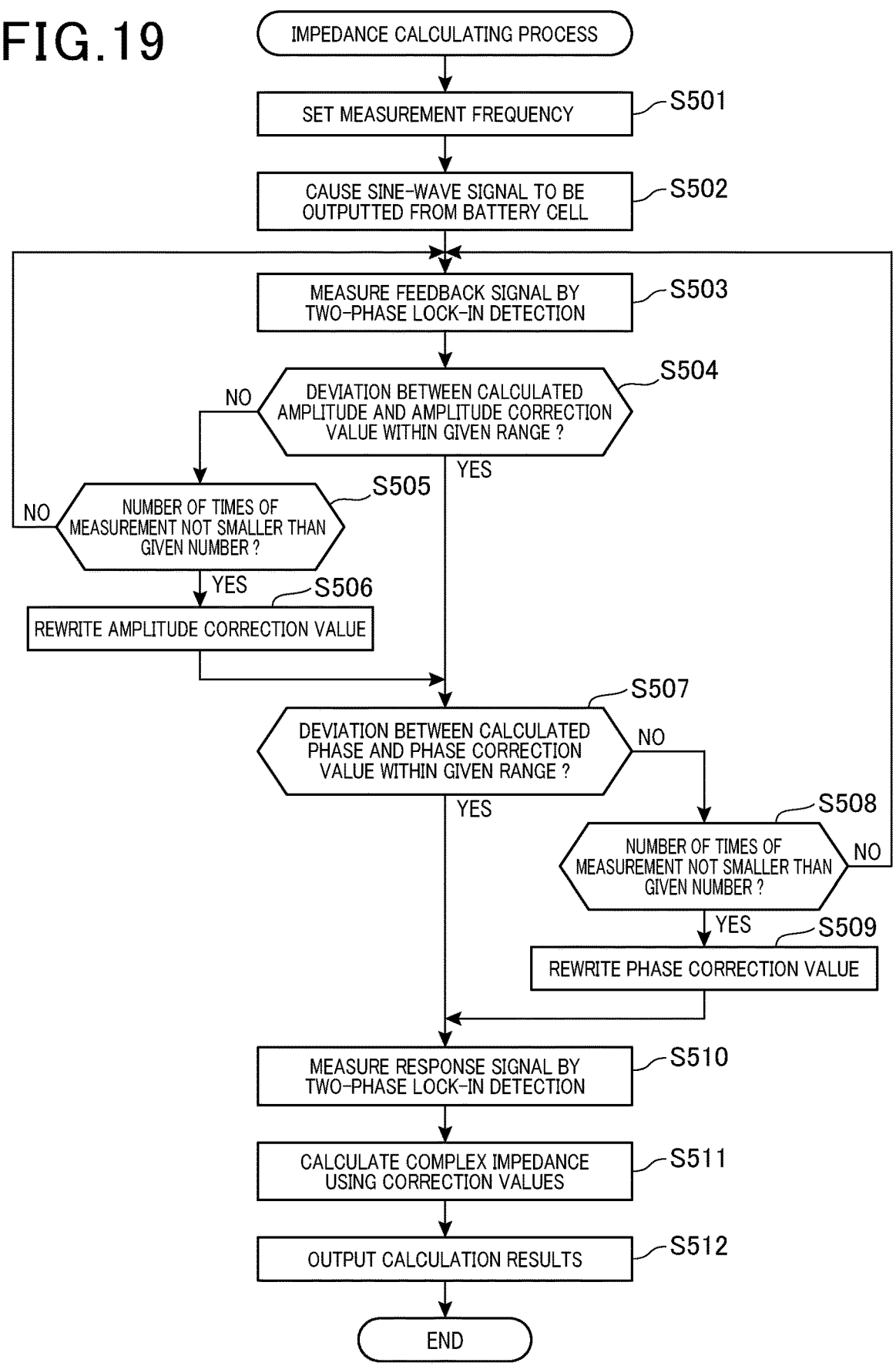
FIG. 19 is a flow chart illustrating a complex impedance calculating process according to a modification.

For example, FIG. 19 illustrates a complex impedance calculating process in which two-phase lock-in detection is performed on the feedback signal as well as on the response signal. This process is repeatedly performed by the battery monitoring apparatus 50 in a predetermined cycle.

In the complex impedance calculating process, first, in step S501, the oscillating circuit 158 sets a measurement frequency of the complex impedance within a predetermined frequency range. In addition, the measurement frequency is determined by, for example, the signal processing unit 155.

In step S502, the oscillating circuit 158 sets the frequency of the sine-wave signal (or predetermined AC signal) based on the measurement frequency set in step S501. Then, the oscillating circuit 158 outputs the command signal, through the digital-to-analog conversion by the DA converter 162, to the current modulation circuit 56 via the command signal output terminal 59a. As described previously, the command signal is indicative of a command commanding the current modulation circuit 56 to cause the sine-wave signal to be outputted from the battery cell 42. Upon receipt of the command signal, the current modulation circuit 56 causes the sine-wave signal to be outputted from the battery cell 42 that is the monitoring target, with the battery cell 42 itself being the electric power source for the output of the sine-wave signal. Consequently, the sine-wave signal is outputted from the battery cell 42.

In step S503, the signal processing unit 155 measures the feedback signal by the two-phase lock-in detection. Specifically, the signal processing unit 155 multiplies the sine-wave signal (or reference signal) commanded by the oscillating circuit 158 and the inputted feedback signal together. Moreover, the signal processing unit 155 multiplies a signal, which is obtained by shifting the phase of the sine-wave signal commanded by the oscillating circuit 158 by 90°, and the inputted feedback signal together. Then, based on the multiplication results, the signal processing unit 155 calculates both the amplitude and the phase of the feedback signal.

In step S504, the signal processing unit 155 determines whether the deviation between the calculated amplitude of the feedback signal and an amplitude correction value is within a given amplitude-deviation range. Here, the amplitude correction value denotes the amplitude of the sine-wave signal desired to be outputted from the battery cell 42.

If the determination in step S504 results in a "NO" answer, then the process proceeds to step S505. In contrast, if the determination in step S504 results in a "YES" answer, then the process proceeds to step S507.

In step S505, the signal processing unit 155 further determines whether the number of times of measurement of the feedback signal in step S503 has been increased to become not smaller than (i.e., greater than or equal to) a given number.

If the determination in step S505 results in a "NO" answer, then the signal processing unit 155 increases the number of times of measurement of the feedback signal by one. Thereafter, the process returns to step S503 to repeat step S503 and the subsequent steps.

On the other hand, if the determination in step S505 results in a "YES" answer, then the process proceeds to step S506.

In step S506, the signal processing unit 155 calculates an average value of the measured amplitudes of the feedback signal and rewrites the amplitude correction value to the average value. Then, the signal processing unit 155 clears the number of times of measurement. Thereafter, the process proceeds to step S507.

In step S507, the signal processing unit 155 determines whether the deviation between the phase of the feedback signal calculated in step S503 and a phase correction value is within a given phase-deviation range. Here, the phase correction value denotes the phase of the sine-wave signal desired to be outputted from the battery cell 42.

If the determination in step S507 results in a "NO" answer, then the process proceeds to step S508. In contrast, if the determination in step S507 results in a "YES" answer, then the process proceeds to step S510.

In step S508, the signal processing unit 155 further determines whether the number of times of measurement of the feedback signal in step S503 has been increased to become not smaller than (i.e., greater than or equal to) the given number.

If the determination in step S508 results in a "NO" answer, then the signal processing unit 155 increases the number of times of measurement of the feedback signal by one. Thereafter, the process returns to step S503 to repeat step S503 and the subsequent steps.

On the other hand, if the determination in step S508 results in a "YES" answer, then the process proceeds to step S509.

In step S509, the signal processing unit 155 calculates an average value of the measured phases of the feedback signal and rewrites the phase correction value to the average value. Then, the signal processing unit 155 clears the number of times of measurement. Thereafter, the process proceeds to step S510.

In step S510, the signal processing unit 155 measures the response signal by the two-phase lock-in detection. For example, the response signal may be measured by performing steps S202, S205 and S206 of the complex impedance calculating process according to the fourth embodiment (see FIG. 11).

In step S511, the signal processing unit 155 calculates, based on the feedback signal and the signals (or values respectively proportional to the real and imaginary parts of the response signal) from the low-pass filters 159 and 161, at least one of the real part, the imaginary part, the absolute value and the phase of the complex impedance of the battery cell 42. Here, the feedback signal is represented by both the amplitude correction value and the phase correction value. The feedback signal is used to correct (or eliminate) any deviation in amplitude or phase between the current signal actually outputted from the battery cell 42 and the sine-wave signal desired to be outputted from the battery cell 42.

In step S512, the signal processing unit 155 outputs the calculation results to the ECU 60 via the communication unit 54. Then, the complex impedance calculating process terminates.

In the above-described complex impedance calculating process, the feedback signal is also measured by the two-phase lock-in detection. Therefore, with the above process, it is possible to accurately measure the current signal actually outputted from the battery cell 42 even in an environment where noise is present. Accordingly, using the feedback signal measured by the two-phase lock-in detection, it is possible to further improve the accuracy of calculation of the complex impedance of the battery cell 42.

(17) In the above-described embodiments, the current signal caused to be outputted from the battery cell 42 is not limited to the sine-wave signal. The current signal may alternatively be other AC signals, such as a rectangular-wave signal or a triangular-wave signal.

(18) In the above-described embodiments, the ECU 60 may be constituted of a plurality of ECUs. Moreover, the ECUs may be provided to respectively perform different functions or to respectively control different control targets. For example, the ECUs may include a battery ECU and an inverter ECU.

(19) In the above-described embodiments, in the case of performing the lock-in detection, the sine-wave signal commanded by the oscillating circuit 158 is used as the first reference signal. Alternatively, the detected signal (i.e., the feedback signal) may be used as the first reference signal. Moreover, in the case of performing the two-phase lock-in detection, a signal, which is obtained by shifting the phase of the detected signal (i.e., the feedback signal), may be used as the second reference signal.

(20) In the above-described embodiments, the battery cells 42 (or the battery modules 41 or the battery pack 40) may be configured to be used as an electric power source for peripheral circuits during the output of the sine-wave signal (or the output of the response signal) therefrom according to the command signal. In contrast, the battery cells 42 (or the battery modules 41 or the battery pack 40) may also be configured to be not used as an electric power source for peripheral circuits during the output of the sine-wave signal (or the output of the response signal) therefrom according to the command signal.

(21) In the above-described embodiments, in arranging the pair of second electrical paths 82 to extend along the longitudinal direction of the circuit board 72, it is desirable to set the distance between the positive-electrode-side second electrical path 82a and the negative-electrode-side second electrical path 82b as short as possible.

(22) In the above-described embodiments, in the case of forming the electrical paths in different layers of the circuit board 72 from each other, it is desirable to offset them from each other so as to lower the stray capacitances between them.

(23) In the above-described embodiments, each of the battery cells 42 may have an explosion-proof valve 90 (i.e., safety valve or pressure-release valve) arranged on the upper end face thereof. In this case, in the state of the circuit board 72 having been arranged at a predetermined position with respect to the battery cells 42, it is desirable for the circuit elements and the electrical paths 81 and 82 to be located outside those regions of the circuit board 72 which are respectively opposed to the explosion-proof valves 90 of the battery cells 42. In other words, it is desirable for the circuit elements and the electrical paths 81 and 82 to be provided on the circuit board 72 so as not to be located directly above the explosion-proof valves 90 of the battery cells 42 and thus not to overlap the explosion-proof valves 90. In addition, the circuit elements provided on the circuit board 72 include, for example, those circuit elements which constitute the ASIC 50a, the filter unit 55 and the current modulation circuit 56 of each of the battery monitoring apparatuses 50.

Moreover, through-holes may be formed in the circuit board 72 so as not be opposed to the explosion-proof valves of the battery cells 42; via the through-holes, cooling air can flow to cool the circuit elements. In the above-described embodiments, the ASIC 50a is arranged on the end portion (i.e., right end portion in FIG. 4) of the circuit board 72 in the longitudinal direction of the circuit board 72 (or the stacking direction of the battery cells 42) so as not to overlap any of the battery cells 42. Therefore, it is easy to form through-holes in the circuit board 72 in the vicinity of the ASIC 50a so as not be opposed to the explosion-proof valves of the battery cells 42. Furthermore, in the case of forming through-holes in the circuit board 72, it is preferable for the electrical paths to be formed as short as possible.

In addition, in the second embodiment, the ASIC 50a is arranged on the second circuit board 72b that extends parallel to the side faces of the battery cells 42 (see FIG. 8). Therefore, it is particularly easy to form through-holes in the vicinity of the ASIC 50a so as not be opposed to the explosion-proof valves of the battery cells 42.

What is claimed is:

1. A battery monitoring apparatus for monitoring a state of a storage battery, the storage battery having a positive-electrode-side electric power supply terminal and a negative-electrode-side electric power supply terminal, the battery monitoring apparatus comprising:
a planar circuit board arranged between the positive-electrode-side and negative-electrode-side electric power supply terminals of the storage battery;
a signal control unit provided in a first electrical path that connects the positive-electrode-side and negative-electrode-side electric power supply terminals of the storage battery, the signal control unit being configured to cause a predetermined AC signal to be outputted from the storage battery through the first electrical path;
a response signal input unit connected with the positive-electrode-side and negative-electrode-side electric power supply terminals of the storage battery respectively via a pair of second electrical paths, the response signal input unit being configured to input, through the pair of second electrical paths, a response signal of the storage battery to the AC signal; and
a microcomputer configured to calculate, based on an acquired current signal and the response signal inputted by the response signal input unit, a complex impedance of the storage battery,
wherein
the first electrical path and the pair of second electrical paths are provided on a major face of the circuit board,
a first region of the circuit board is surrounded by the first electrical path, the pair of second electrical paths and the positive-electrode-side and negative-electrode-side electric power supply terminals of the storage battery, and
a size of the first region is such that an induced electromotive force, which is induced in the pair of second electrical paths by the AC signal flowing through the first electrical path, is within an allowable electromotive-force range which includes zero.

2. The battery monitoring apparatus as set forth in claim 1, wherein
the storage battery further has a pair of positive and negative electrodes, which are respectively connected with the positive-electrode-side and negative-electrode-side electric power supply terminals of the storage battery, and a receiving case that receives the positive and negative electrodes therein,
a second region of the storage battery is between the first electrical path and an end face of the storage battery, and
the size of the first region is set according to the second region to have a difference between a first magnetic flux and a second magnetic flux be within an allowable magnetic-flux-difference range which includes zero, the first magnetic flux being generated by the AC signal to flow through the first region, the second magnetic flux being generated by the AC signal to flow through the second region.

3. The battery monitoring apparatus as set forth in claim 1, wherein within the first region, there is arranged an electrically conductive member, and both the size of the first region and a size of the electrically conductive member are set to have the induced electromotive force be within the allowable electromotive-force range.

4. The battery monitoring apparatus as set forth in claim 1, wherein the signal control unit, the response signal input unit, the microcomputer, the first electrical path and the pair of second electrical paths are located on a same plane.

5. The battery monitoring apparatus as set forth in claim 1, wherein the circuit board comprises a first circuit board having the signal control unit arranged thereon and a second circuit board having both the response signal input unit and the microcomputer arranged thereon,
the storage battery is shaped as a flat rectangular cuboid and has both the positive-electrode-side and negative-electrode-side electric power supply terminals provided on an end face thereof,
the first circuit board is arranged between the positive-electrode-side and negative-electrode-side electric power supply terminals of the storage battery to face the end face of the storage battery on which the positive-electrode-side and negative-electrode-side electric power supply terminals are provided,
the second circuit board is perpendicular to the first circuit board and opposed to a side face of the storage battery, and
the second circuit board is surrounded by an electrically-conductive shield member.

6. The battery monitoring apparatus as set forth in claim 5, wherein the storage battery further has a pair of positive and negative electrodes, which are respectively connected with the positive-electrode-side and negative-electrode-side electric power supply terminals of the storage battery, and a receiving case that receives the positive and negative electrodes therein, and
the shield member is formed to share a side wall with the receiving case.

7. The battery monitoring apparatus as set forth in claim 1, wherein the storage battery has an explosion-proof valve provided therein,
the circuit board is arranged at a predetermined position with respect to the storage battery, and
circuit elements, which constitute the signal control unit, the response signal input unit and the microcomputer, and the first and second electrical paths are provided on the circuit board so as to be located outside a region of the circuit board which is opposed to the explosion-proof valve of the storage battery.

8. The battery monitoring apparatus as set forth in claim 1, wherein the signal control unit is configured to cause the predetermined AC signal to be outputted from the storage battery with the storage battery being an electric power source for of the predetermined AC signal.

* * * * *